(12) United States Patent
Appenzeller et al.

(10) Patent No.: US 8,017,934 B2
(45) Date of Patent: Sep. 13, 2011

(54) CARBON NANOTUBE BASED INTEGRATED SEMICONDUCTOR CIRCUIT

(75) Inventors: Joerg Appenzeller, West Lafayette, IN (US); AJ Kleinosowski, Seattle, WA (US); Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/850,259

(22) Filed: Aug. 4, 2010

(65) Prior Publication Data

US 2010/0295025 A1 Nov. 25, 2010

Related U.S. Application Data

(62) Division of application No. 11/972,669, filed on Jan. 11, 2008, now Pat. No. 7,786,466.

(51) Int. Cl.
*H01L 51/00* (2006.01)

(52) U.S. Cl. ........... 257/24; 257/E51.04; 977/742; 977/750; 977/751; 977/752

(58) Field of Classification Search .......... 257/24, 257/E51.04; 977/742, 750–752
See application file for complete search history.

(56) References Cited

U.S. PATENT DOCUMENTS

| | | | |
|---|---|---|---|
| 7,348,675 B2 * | 3/2008 | Dubin et al. .......... | 257/774 |
| 2002/0117659 A1 | 8/2002 | Lieber et al. | |
| 2005/0180194 A1 | 8/2005 | Kang | |
| 2005/0212079 A1 | 9/2005 | Stumbo et al. | |
| 2006/0226551 A1 * | 10/2006 | Awano .......... | 257/773 |
| 2008/0031034 A1 | 2/2008 | Jalabert | |
| 2008/0276987 A1 * | 11/2008 | Flood .......... | 136/256 |

OTHER PUBLICATIONS

Avouris, Phaedon et al., "Nanotube electronics and optoelectronics", Materials Today, Oct. 2006, pp. 46-54, vol. 9, No. 10, Elsevier Ltd.
Pennington, G. et al., "Semiclassical transport and phonon scattering of electrons in semiconducting carbon nanotubes", Physical Review, Jul. 30, 2003, pp. 045426/1-0454261/11, The American Physical Society.

(Continued)

*Primary Examiner* — Jami M Valentine
(74) *Attorney, Agent, or Firm* — Scully, Scott, Murphy & Presser, P.C.; Richard M. Kotulak, Esq.

(57) ABSTRACT

Gate electrodes are formed on a semiconducting carbon nanotube, followed by deposition and patterning of a hole-inducing material layer and an electron inducing material layer on the carbon nanotube according to the pattern of a one dimensional circuit layout. Electrical isolation may be provided by cutting a portion of the carbon nanotube, forming a reverse biased junction of a hole-induced region and an electron-induced region of the carbon nanotube, or electrically biasing a region through a dielectric layer between two device regions of the carbon nanotube. The carbon nanotubes may be arranged such that hole-inducing material layer and electron-inducing material layer may be assigned to each carbon nanotube to form periodic structures such as a static random access memory (SRAM) array.

19 Claims, 19 Drawing Sheets

OTHER PUBLICATIONS

Chen, Jia, "Self-aligned Carbon Nanotube Transistors with Novel Chemical Doping", 0-7803-8684-1/04, pp. 695-698, IEEE (2004).

Kang, Donghun, "Oxygen-induced p-type doping of a long individual single-walled carbon nanotube", Nanotechnology, May 12, 2005, pp. 1048-1052, vol. 16, Issue 8, Institute of Physics Publishing.

Crespi, Vincent H. et al., "In Situ Band Gap Engineering of Carbon Nanotubes", Physical Review Letters, Sep. 15, 1997, pp. 2093-2096, vol. 79, No. 11, The American Physical Society.

Lin, Yu-Ming et al., "High-Performance Carbon Nanotube Field-Effect Transistor with Tunable Polarities", IEEE (2004).

Arnold, Michael S. et al., "Sorting carbon nanotubes by electronic structure using density differentiation", Nature Nanotechnology, 2006, pp. 1-13.

Javey, Ali et al., "High Performance n-Type Carbon Nanotube Field-Effect Transistors with Chemically Doped Contacts", Nano Letters, Jan. 22, 2005, pp. 345-348, vol. 5, No. 2, American Chemical Society.

* cited by examiner

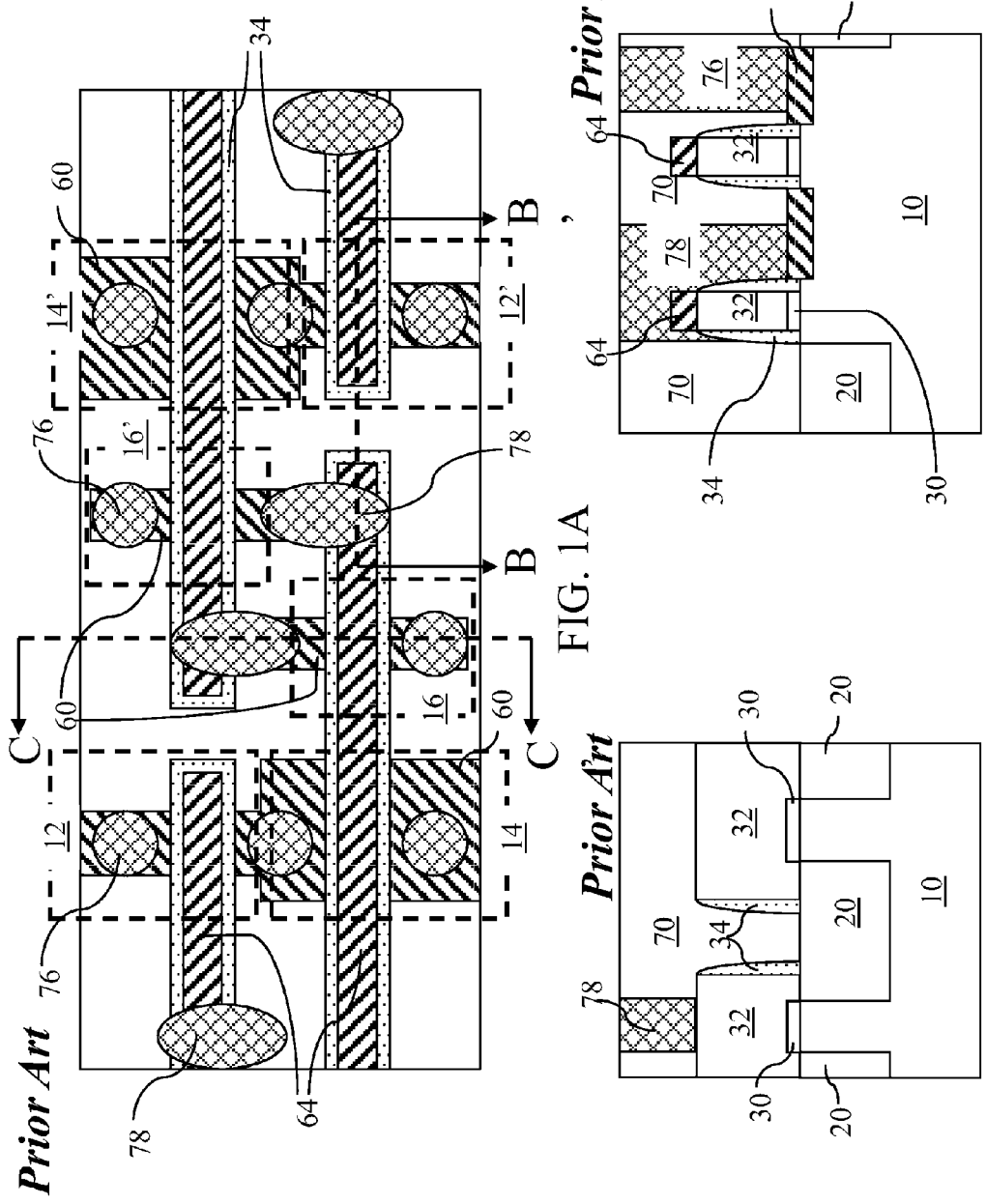

CARBON NANOTUBE BASED INTEGRATED SEMICONDUCTOR CIRCUIT

CROSS REFERENCE TO RELATED APPLICATION

This application is a divisional of U.S. patent application Ser. No. 11/972,669, filed Jan. 11, 2008 the entire content and disclosure of which is incorporated herein by reference.

FIELD OF THE INVENTION

The present invention related to semiconductor structures, and particularly to carbon nanotube based semiconductor circuits and methods of manufacturing the same.

BACKGROUND OF THE INVENTION

As scaling for conventional CMOS integrated circuits approaches quantum mechanical limits, alternative nanostructures and materials have been investigated in the semiconductor industry. Of such nanostructures and materials, carbon nanotubes (CNTs) offer excellent intrinsic properties that are suitable for high performance nanoscale devices.

A key advantage of CNTs over conventional CMOS devices is that scaling limitations of MOSFETs due to boundary scattering of electrons from imperfect interfaces are solved naturally in CNTs which have a smooth, well coordinated graphene structure with no bonds to the outside. This enables CNTs to retain excellent transport properties to much smaller lateral dimensions than silicon. The small radius and possibility of completely surrounding the CNT by a gate provide excellent electrostatic confinement of channel electrons, enabling the channel length to be scaled down to very small dimensions, and their small size would enable high packing densities. Band structure calculations of CNTs according to P. Avouris and J. Chen, "Nanotube electronics and optoelectronics," Materials Today, Vol. 9, pp. 46-54, (2006) show that conduction and valence bands are mirror images of each other, i.e., both electrons and holes should share equally good transport properties. This indicates suitability of CNTs for a general-purpose high-performance complementary circuit technology.

As is now well known, CNTs can be either metallic or semimetallic, depending on their chirality and have a bandgap which is inversely proportional to their diameter for the semiconducting tubes. A useful relation, derived from tight binding calculations, between the diameter and the band gap, $E_g$ of a CNT is $$E_g = \gamma(2d_{C-C}/\sqrt{3}d_{CNT}), \quad \text{equation (1)}$$

where $\gamma$ is the hopping matrix element, $d_{C-C}$ is the C—C bond distance, and $d_{CNT}$ is the diameter of the carbon nanotube. Inclusion of electron-electron interactions raises the size of the bandgap, $E_g$ significantly. For a 1 nm nanotube, the band gap is roughly 1 eV. The best transport measurements and device characteristics have been obtained on rather larger diameter nanotubes, with their diameter in the 1.7-3 nm range. The idealized electron/hole dispersion relation is hyperbolic in shape, with a quasi parabolic "effective mass" regime at lower energies and a linear "constant velocity" regime at higher energies, where the limiting velocity, $v_{lim}$, is ~5-10×10$^7$ cm/sec according to G. Pennington and N. Goldsman, "Semiclassical transport and phonon scattering of electrons in semiconducting carbon nanotubes," Phys. Rev. B 68, 045426 (2003).

Methods of inducing one type of charge carriers, e.g., holes or electrons, in a carbon nanotube are known in the art. Typically, a hole-inducing material layer or an electron-inducing material layer may be deposited on a carbon nanotube to induce either holes or electrons within the carbon nanotube. For example, methods disclosed in J. Chen, et al., "Self Aligned Carbon Nanotube Transisors with Novel Chemical Doping," 2004 Transactions of the International Electron Device Meeting, pp. 695-698, (2004) and D. Kang et al, "Oxygen-induced p-type doping of a long individual single-walled carbon nanotube" Nanotechnology 16 pp. 1048-1052, (2005) may be employed to form a carbon nanotube of one conductivity type, i.e., a carbon nanotube in which one type of charge carriers are predominant over the opposite type of charge carriers. Contacts and electrodes may be formed on such a carbon nanotube to form a discrete semiconductor component such as a discrete transistor.

Fabrication of an integrated circuit comprising multiple discrete carbon nanotube devices and an interconnect wiring that provides electrical connections amongst them is a more difficult challenge than formation of a carbon nanotube based discrete semiconductor component. This is because carbon nanotubes are formed as discrete wires that need to be aligned on a substrate. While technological advances are being made to improve alignment of carbon nanotubes, alignment of carbon nanotubes still requires meticulous manipulation of discrete carbon nanotubes.

The lack of ability to tailor the size of carbon nanotubes and to place them in arbitrary location and orientation is a major constraint in fabricating an integrated carbon nanotube circuit. The difficulty of fabricating an integrated circuit out of carbon nanotubes due to this constraint is readily seen when typical semiconductor structures are examined. As an illustrative example, a prior art static random access memory (SRAM) cell formed by conventional semiconductor manufacturing methods is employed herein. SRAM is a memory device employing six transistors. SRAM cell design typically begins by picking the smallest PFET supported by a given technology for two pull-up PFETs, followed by scaling of NFET pass gate transistors and pull-down NFET transistors for optimal beta ratio, cell stability, and access time.

Referring to FIG. 1A-1C, an exemplary prior art SRAM structure comprises a first pull-up PFET 16, a second pull-up PFET 16', two pull down NFETs (14, 14'), and two pass gate NFETs (12, 12'). FIG. 1A is a top-down view of the exemplary prior art structure up to the CA level not showing a middle-of-line (MOL) dielectric 70. FIG. 1B is a vertical cross-sectional view of the exemplary prior structure along the plane B-B' showing the MOL dielectric 70. FIG. 1C is a vertical cross-sectional view of the exemplary prior structure along the plane C-C' showing the MOL dielectric 70. Each of the transistors (12, 12', 14, 14', 16, 16') comprise a portion of the semiconductor substrate 10, a gate dielectric 30, a gate conductor 32, a gate spacer 34, active area (AA) silicides 60, and gate top silicides 64. Shallow trench isolation 20 physically separates the transistors (12, 12', 14, 14', 16, 16') and provides electrical isolation among the transistors (12, 12', 14, 14', 16, 16'). CA contact vias 76 and CA bars 78 are employed to provide electrical wiring among the transistors (12, 12', 14, 14', 16, 16'). One of the CA bars 78, which contacts one of the AA silicides 60 of the first pull-up PFET 16 as well as the gate top silicides 64 of the second pull-up PFET 16' as shown in FIG. 1B, provides electrical connection between the drain of the first pull-up PFET 16 and the gate of the second pull-up PFET 16' Likewise, another CA bar 78 provides electrical connection between the drain of the second pull-up PFET 16' and the gate of the first pull-up PFET 16.

Referring to FIGS. 2A-2C, the exemplary prior art SRAM structure is shown up to the M1 level. FIG. 2A is a top-down view of the exemplary prior art structure up to the M1 level not showing the middle-of-line (MOL) dielectric 70 and an M1 dielectric 80. FIG. 2B is a vertical cross-sectional view of the exemplary prior structure along the plane B-B' showing the MOL dielectric 70 and the M1 dielectric 80. FIG. 2C is a vertical cross-sectional view of the exemplary prior structure along the plane C-C' showing the MOL dielectric 70 and the M1 dielectric 80. M1 wires 88 embedded within the M1 dielectric 80 contact the underlying CA contact vias 76 and the CA bars 78. In the exemplary prior art SRAM structure, FIGS. 2A and 2C illustrate that the drain of each of the two pull-up transistors (16, 16') is electrically connected to a node at which a source/drain of one of the pass gate transistors (12, 12') adjoins the drain of one of the pull-down NFETs (14, 14') by a combination of a CA bar 78, an M1 wire 88, and a CA contact via 76. Two such combinations are present in each SRAM cell structure which comprises six transistors (12, 12', 14, 14', 16, 16').

Referring to FIG. 3, a circuit schematic 18 for the exemplary prior art SRAM structure shows a first pair of a first pass gate n-type field effect transistor (NFET) 2 and a first pull-down n-type field effect transistor (NFET) 4 wherein a first source/drain of the first pass gate NFET 2 and a first drain of the first pull down NFET 4 are adjoined to form an electrical connection. In the physical structure, this electrical connection is achieved by a first common active area that contains both the first source/drain of the first pass gate NFET 2 and the first drain of the first pull-down NFET 4. Similarly, a second source/drain of the second pass gate NFET 2' and a second drain of a second pull-down NFET 4' are adjoined to form another electrical connection. In the physical structure, this electrical connection is achieved by a second common active area that contains both the second source/drain of the second pass gate NFET 2' and the second drain of the second pull-down NFET 4'. The circuit schematic 18 further comprises a first pull-up p-type field effect transistor (PFET) 6 containing a third drain, which is physically a third active area, and a second pull-up PFET 6' containing a fourth drain, which is physically a fourth active area. Each of the source/drain nodes of the pass gate transistors (2, 2') may function as a source or a drain depending on the operation of the SRAM circuit.

The third active area is electrically connected to the first active area via a collection of a first contact via, a first M1 wire, and a first CA bar. This connection is represented in the circuit schematic 18 by a first internal node 11. Similarly, the fourth active area is electrically connected to the second active area via a collection of a second contact via, a second M1 wire, and a second CA bar. This connection is represented in the circuit schematic 18 by a second internal node 11'. The gates of the second pull-up PFET 6' and the second pull-down NFET 4' are adjoined to the third drain of the first pull-up PFET 6 via the first CA bar. This connection is represented in the circuit schematic 18 by a third internal node 13A and a fourth internal node 13B. The gates of the first pull-up PFET 6 and the first pull-down NFET 4 are adjoined to the fourth drain of the second pull-up PFET 6' via the first CA bar. This connection is represented in the circuit schematic 18 by a fifth internal node 13A' and a sixth internal node 13B'. The internal nodes (11, 11', 13A, 13B, 13A' 13B') are connected by CA contact vias 76 and CA bars 78 as well as M1 wires 88. Bit line wiring (15, 15') and word line wiring (17, 17') are typically implemented at M2 and M3 levels.

One important aspect of the exemplary prior art SRAM structure is the ability to form two dimensional active areas in any size, in any location, and, unless limited by design rules, in any orientation. Since the relative location of the components of the exemplary prior art SRAM is fixed in a top-down view, the interconnect wiring may be formed by aligning interconnect level masks to the pattern of the components in a lower level. Thus, the layout of circuit components in the exemplary prior art SRAM is inherently two dimensional, which is reflected in the circuit schematic in FIG. 3. In general, conventional silicon based semiconductor devices are formed taking full advantage of a two-dimensional layout to reduce the number of wiring levels, and consequently, to reduce cost.

FIG. 4 is a schematic of an exemplary prior art latch circuit which takes in an input signal from a data node labeled "data" at a specific phase of a signal on the clock node labeled "c2," for example, at a positive transition or at a negative transition, and stores data on the latch L2 and provides an output to the output node labeled "L2_n." The circuit layout is two dimensional, and so are typical physical implementations of this circuit layout in a semiconductor device.

As discussed above, however, the carbon nanotubes do not easily render themselves to positioning in arbitrary locations or angles on a substrate. An ordered arrangement of carbon nanotubes is a low entropy state, and manufacture of such a highly ordered arrangement of carbon nanotubes is consequently prone to low yield. For a carbon nanotube based integrated circuit to have realistic and economical manufacturability, requirement on the physical arrangement of the carbon nanotubes needs to be minimal. Thus, simple arrangements of a carbon nanotube, or even fabrication of an integrated circuit on a single carbon nanotube would be desired.

In view of the above, there exists a need for a carbon nanotube based semiconductor circuit structure that is technologically less demanding, easily manufacturable, and economical.

Particularly, there exists a need for a carbon nanotube based semiconductor circuit structure in which as many circuit elements are manufactured on the same nanotube to minimize alignment requirement on the carbon nanotubes.

Further, there exists a need for a carbon nanotube based semiconductor circuit structure in which the pattern of arrangement of the carbon nanotubes is as simplified as possible, as well as simplifying the pattern of the materials needed to render the carbon nanotubes functional, such as hole-inducing material layers and electron-inducing material layers.

SUMMARY OF THE INVENTION

The present invention addresses the needs described above by providing integrated carbon nanotube structures formed on a single carbon nanotube or on a plurality of parallel carbon nanotubes, in which multiple semiconductor devices are formed on one carbon nanotube and methods of manufacturing the same.

In the present invention, a conventional semiconductor circuit layout is reconfigured as a one dimensional circuit layout in which field effect transistors are connected in series with alternating power supply connections and ground connections in between. Gate electrodes are formed on a semiconducting carbon nanotube, followed by deposition and patterning of a hole-inducing material layer and an electron inducing material layer on the carbon nanotube according to the pattern of the one dimensional circuit layout. Specifically, a p-type field effect transistor is formed by a portion of the hole-inducing material layer and an n-type field effect transistor is formed by a portion of the electron-inducting material layer. Electrical isolation may be provided by cutting a portion of the carbon nanotube, forming a reverse biased junction of a hole-induced region and an electron-induced region of the carbon nanotube, or electrically biasing a region through a dielectric layer between two device regions of the carbon nanotube. The carbon nanotubes may be arranged such that hole-inducing material layer and electron-inducing material layer may be assigned to each carbon nanotube to form periodic structures such as a static random access memory (SRAM) array.

According to an aspect of the present invention, a semiconductor structure is provided, which comprises:

a first semiconductor device located on a first region of a semiconducting carbon nanotube located on a substrate, wherein charge carriers in the first region are predominantly holes;

a second semiconductor device located on a second region located in the semiconducting carbon nanotube, wherein charge carriers in the second region are predominantly electrons; and a laterally abutting pair of a third region and a fourth region of the semiconducting carbon nanotube, wherein the laterally abutting pair is located in the semiconducting carbon nanotube, wherein charge carriers are predominantly electrons in the third region and predominantly holes in the fourth region, and wherein the third region laterally abuts the first region and the fourth region laterally abuts the second region.

In one embodiment, the first region, the third region, the second region, and the fourth region form a p-n-p-n junction within the semiconducting carbon nanotube.

In another embodiment, the first semiconductor device is a p-type field effect transistor and the second semiconductor device is an n-type field effect transistor.

In yet another embodiment, the semiconductor structure further comprises:

a portion of a hole-inducing material layer located directly on the first region, wherein the portion of the hole-inducing material layer induces holes in, and repels electrons from, the first region; and a portion of an electron-inducing material layer located directly on the second region, wherein the portion of the electron-inducing material layer induces electrons in, and repels holes from, the second region.

According to another aspect of the present invention, another semiconductor structure is provided, which comprises:

a first semiconductor device located on a first region of a semiconducting carbon nanotube located on a substrate, wherein charge carriers in the first region are predominantly of a first conductivity type;

a second semiconductor device located on a second region of the semiconducting carbon nanotube, wherein charge carriers in the second region are predominantly of the first conductivity type; and a third region of the semiconducting carbon nanotube, wherein charge carriers in the third region are predominantly of a second conductivity type which is the opposite of the first conductivity type, and wherein the third region laterally abuts the first region and the second region.

In one embodiment, the first region, the third region, and the second region form a p-n-p junction or an n-p-n junction within the semiconducting carbon nanotube.

In another embodiment, the first semiconductor device and the second semiconductor device are a pair of p-type field effect transistors or a pair of n-type field effect transistors.

In yet another embodiment, the semiconductor structure further comprises:

a portion of a charge-carrier-inducing material layer located directly on the first region, wherein the portion of the charge-carrier-inducing material layer induces charge carriers of a conductivity type in, and repels charge carriers of an opposite conductivity type from, the first region; and another portion of the charge-carrier-inducing material layer located directly on the second region, wherein the another portion of the charge-carrier-inducing material layer induces charge carriers of the conductivity type in, and repels charge carriers of the opposite conductivity type from, the second region.

According to yet another aspect of the present invention, yet another semiconductor structure is provided, which comprises:

a first semiconductor device located on a first semiconducting carbon nanotube located on a substrate; and a second semiconductor device located on a second semiconducting carbon nanotube, wherein the second semiconducting carbon nanotube is located on the substrate, have a same diameter as the first semiconducting carbon nanotube, is coaxially aligned to the first semiconducting carbon nanotube, and is disjoined from the first semiconducting carbon nanotube.

According to still another aspect of the present invention, still another semiconductor structure is provided, which comprises a plurality of semiconducting carbon nanotubes arranged parallel to one another on a substrate, wherein a predominant portion of at least one semiconducting carbon nanotube is of a first conductivity type and a predominant portion of at least another semiconducting carbon nanotube is of a second conductivity type, wherein the second conductivity type is the opposite of the first conductivity type.

In one embodiment, the plurality of semiconducting carbon nanotubes comprise:

a first semiconducting carbon nanotube, wherein a predominant portion of the first semiconducting carbon nanotube is of p-type;

a second semiconducting carbon nanotube located next to and on one side of the first semiconducting carbon nanotube, wherein a predominant portion of the second semiconducting carbon nanotube is of n-type; and a third semiconducting carbon nanotube located next to and on an opposite side of the first semiconducting carbon nanotube, wherein a predominant portion of the third semiconducting carbon nanotube is of n-type.

According to a further aspect of the present invention, a method of forming a semiconductor structure is provided, which comprises:

forming a semiconducting carbon nanotube on a substrate, forming and patterning a first charge-carrier-inducing material layer on the semiconducting carbon nanotube, wherein the first charge-carrier-inducing material layer induces charges of a first conductivity type in at least one underlying region of the semiconducting carbon nanotube;

forming and patterning a second charge-carrier-inducing material layer on the second charge carbon nanotube, wherein the second charge-carrier-inducing material layer induces charges of a second conductivity type in at least another underlying region of the semiconducting carbon nanotube, wherein the second conductivity type is the opposite of the first conductivity type; and forming an electrical isolation structure electrically isolating the at least one underlying region from the at least another underlying region.

BRIEF DESCRIPTION OF THE DRAWINGS

FIGS. 1A-1C and 2A-2C show an exemplary prior art SRAM structure. FIGS. 1A-1C show the exemplary prior art SRAM structure up to the CA level. FIGS. 2A-2C show the exemplary prior art SRAM structure up to the M1 level. FIGS. 1A and 2A are top down views in which a middle-of-line (MOL) dielectric 70 and an M1 dielectric 80 are not shown. FIGS. 1B and 2B are vertical cross-sectional views of the exemplary prior structure along the plane B-B' showing the MOL dielectric 70. FIGS. 1C and 2C are vertical cross-sectional views of the exemplary prior structure along the plane C-C' showing the MOL dielectric 70 and the M1 dielectric 80.

DETAILED DESCRIPTION OF THE INVENTION

As stated above, the present invention relates to carbon nanotube based semiconductor circuits and methods of manufacturing the same, which are now described in detail with accompanying figures.

According to the present invention, multiple semiconductor components are formed on a single semiconducting carbon nanotube. A circuit may be formed employing semiconductor components formed on one semiconducting carbon nanotube on a substrate or on a plurality of semiconducting carbon nanotubes arranged parallel to one another on a substrate. To form multiple semiconductor components on a single carbon nanotube, linear circuit schematics in which semiconductor component are laterally connected in one dimension may be employed.

Figure 2A:
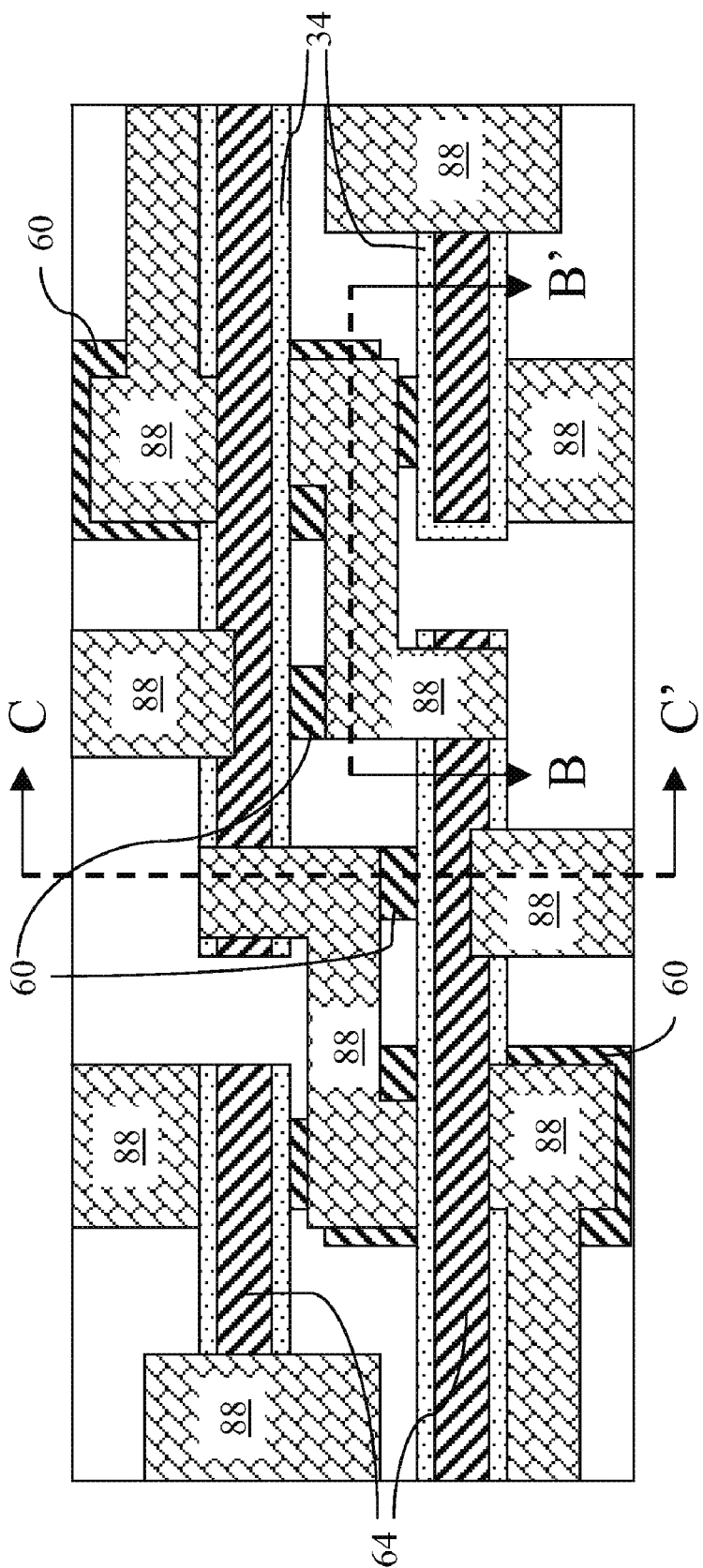
Figure 2C:
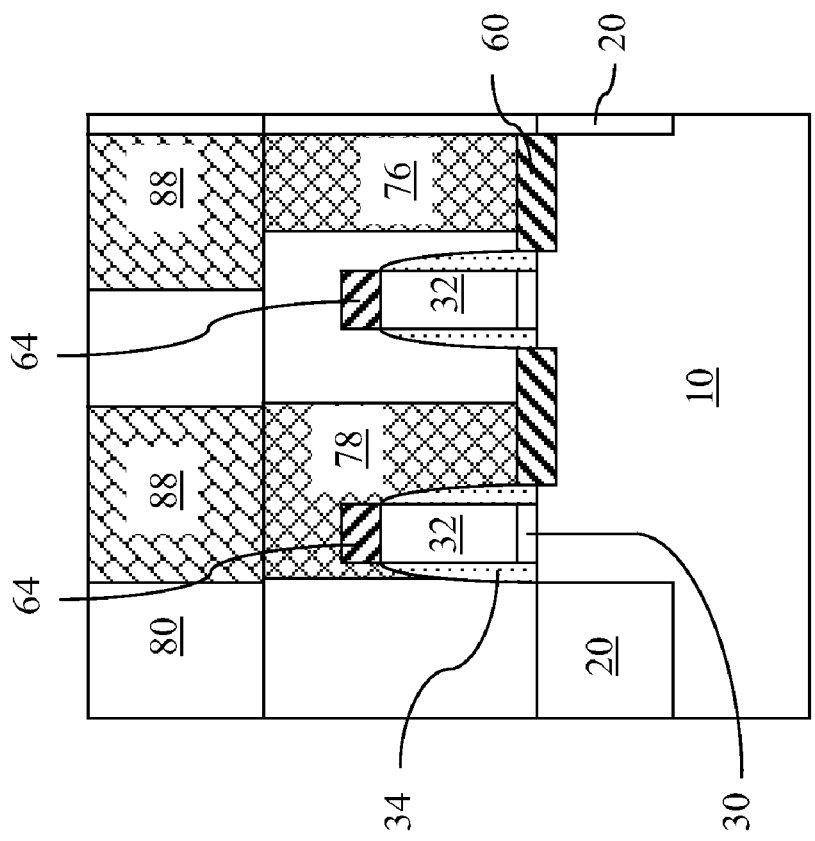
Figure 2B:
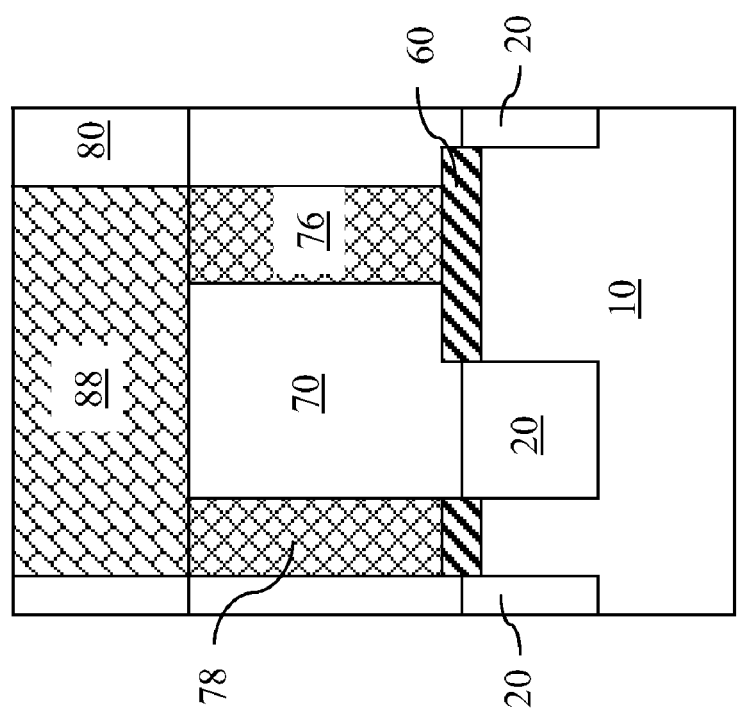
Figure 3:
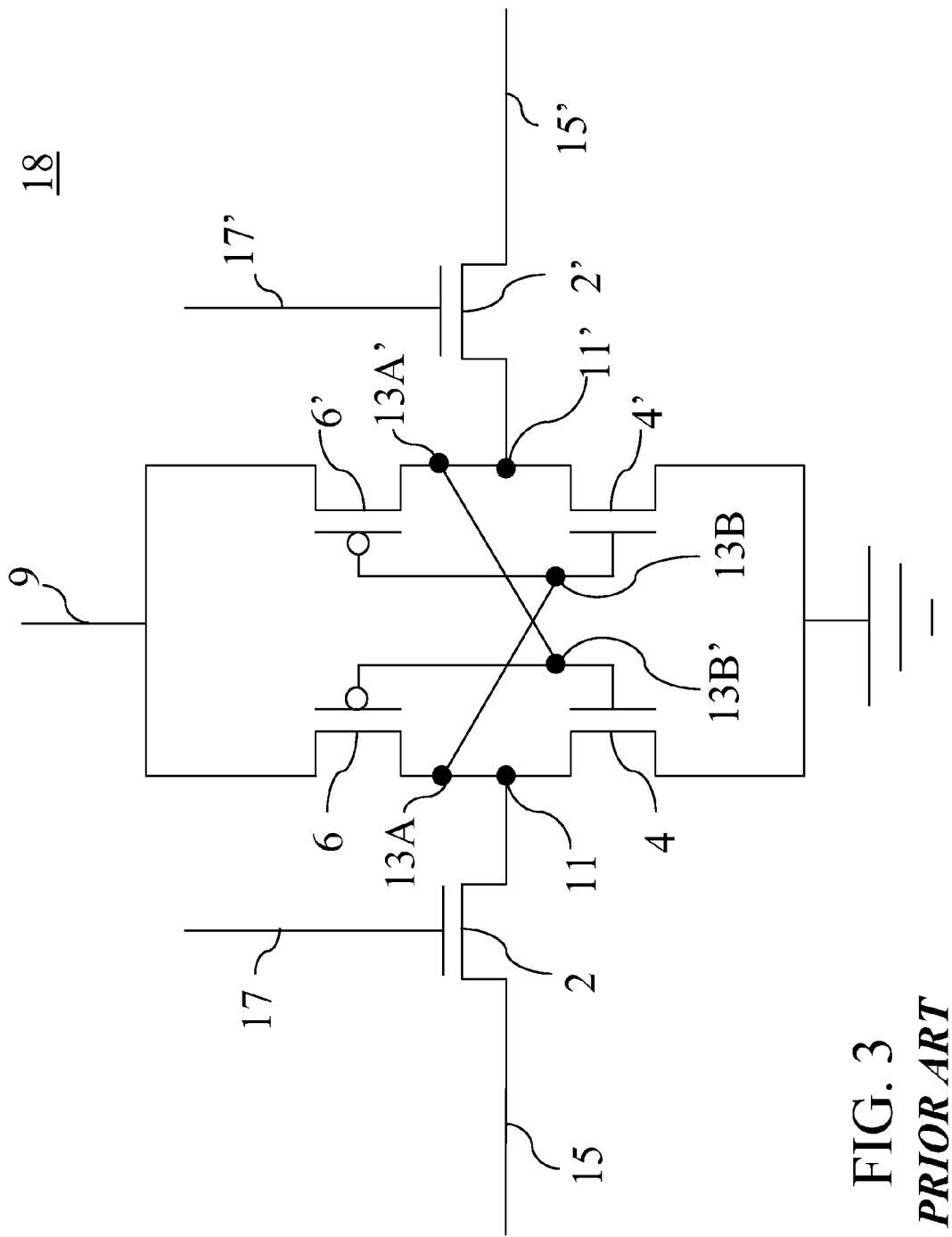
FIG. 3 is a two-dimensional circuit schematic for the exemplary prior art SRAM structure.
Figure 5:
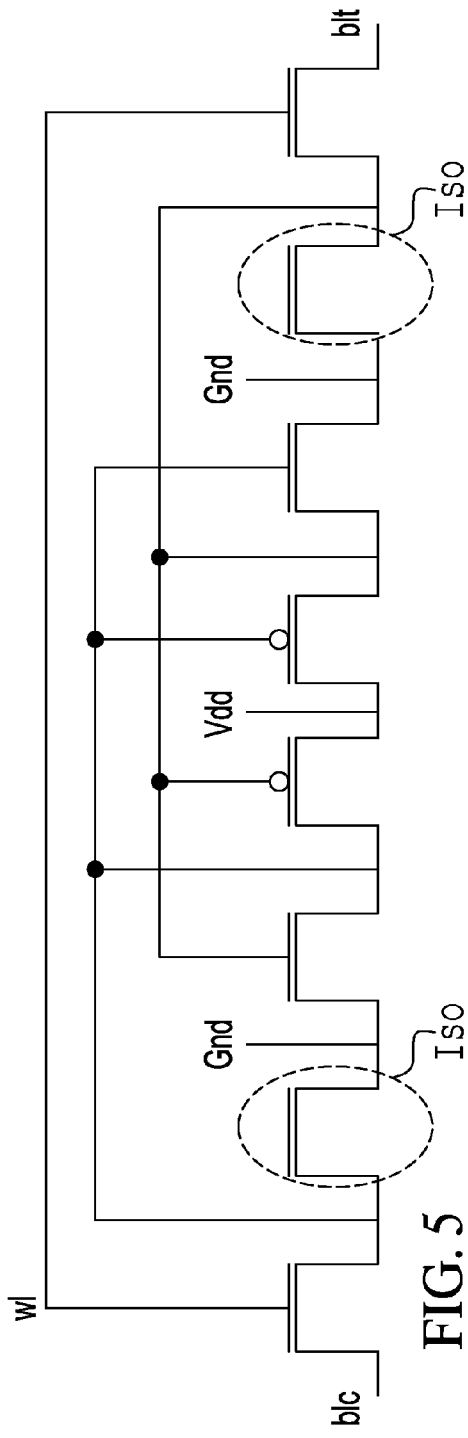
FIG. 5 is a linear circuit schematic of an SRAM according to the present invention.

Referring to FIG. 5, a liner circuit schematic for a static random access memory (SRAM) cell demonstrates an example of a conversion of the two dimensional circuit schematic of the exemplary prior art SRAM structure, which is shown in FIG. 3, into a linear circuit schematic. The linear circuit schematic of an SRAM cell comprises four n-type field effect transistors and two p-type field effect transistors in a linear arrangement in which sources and drains of transistors are connected in a linear chain. Two objects that are labeled "Iso" represent isolation structures that provide electrical isolation between field effect transistors to which the isolation structures are connected. A connection to a power supply source is labeled with "Vdd," connections to the ground are labeled with "Gnd," a connection to a word line is labeled "wl," a connection to a true bit line is labeled "blt," and a connection to a complementary bit line is labeled "bk."

Figure 4:
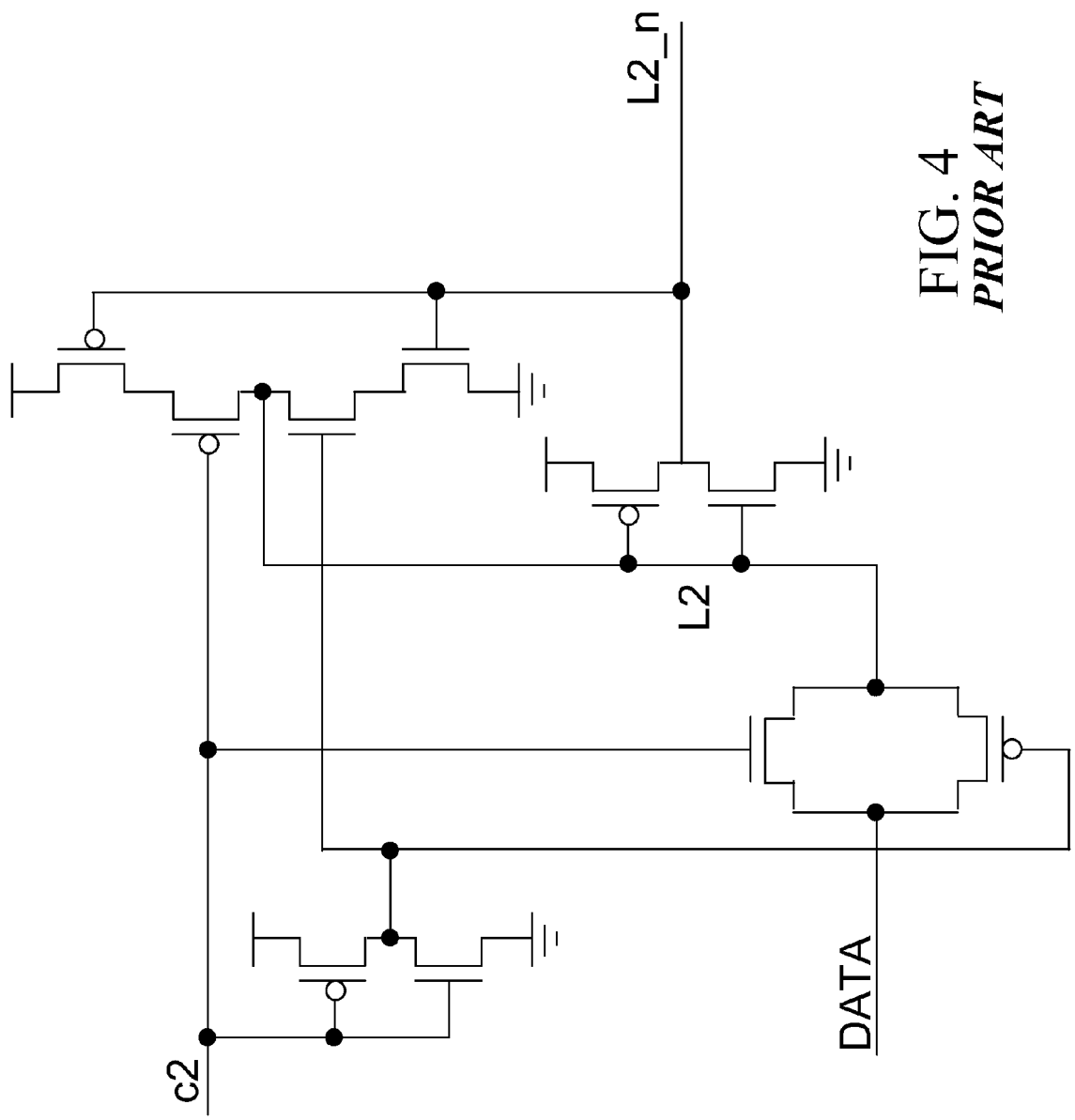
FIG. 4 is a two dimensional circuit schematic for an exemplary prior art latch circuit.
Figure 6:
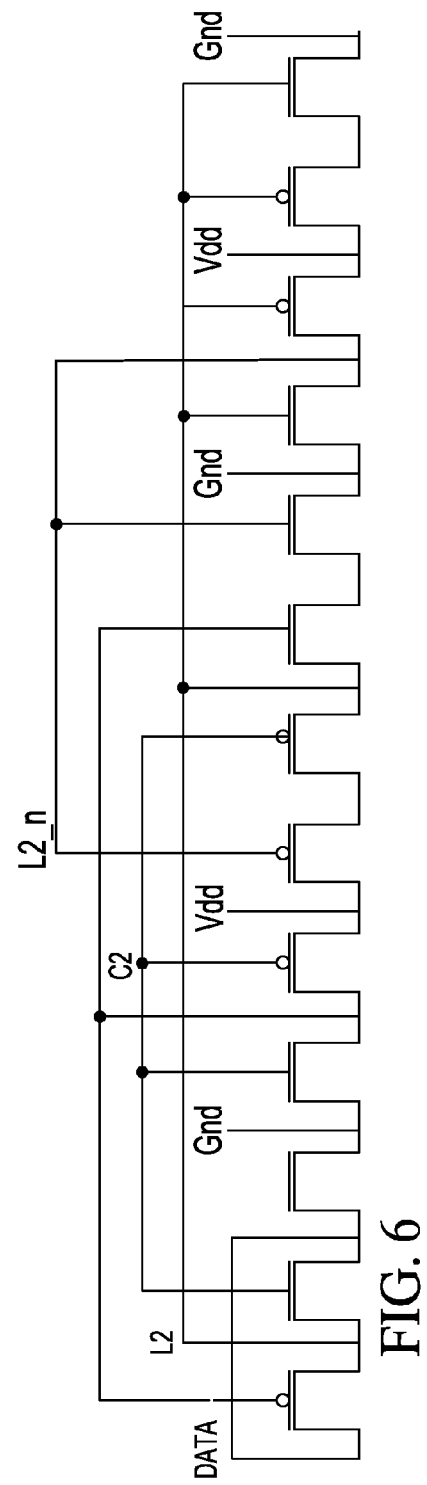
FIG. 6 is a linear circuit schematic of an exemplary latch circuit according to the present invention.

Referring to FIG. 6, a linear circuit schematic for a latch circuit demonstrates another example of a conversion of the two dimensional circuit schematic for a latch shown in FIG. 4 into a linear circuit schematic. Two objects that are labeled "Iso" represent isolation structures as in FIG. 5. Connections to a power supply source are labeled with "Vdd," connections to the ground are labeled with "Gnd," a connection to a clock node is labeled "c2," a connection to a data node is labeled "Data," a connection to a latch node is labeled "L2,"and a connection to a complement of the latch node is labeled "L2_n." The two examples in FIGS. 5 and 6 demonstrate that most two dimensional circuit schematics may be converted into linear circuit schematics without introducing excessive wiring or even with simplified wiring. In fact, all two dimensional circuit schematics may be converted into a linear circuit schematic if unlimited levels of wiring are permitted. Thus, conversion from two-dimensional circuit schematics to linear circuit schematics is limited only by practicality of the conversion, and most of the time, the conversion may be effected without introducing excessive levels of wiring.

Figure 7:
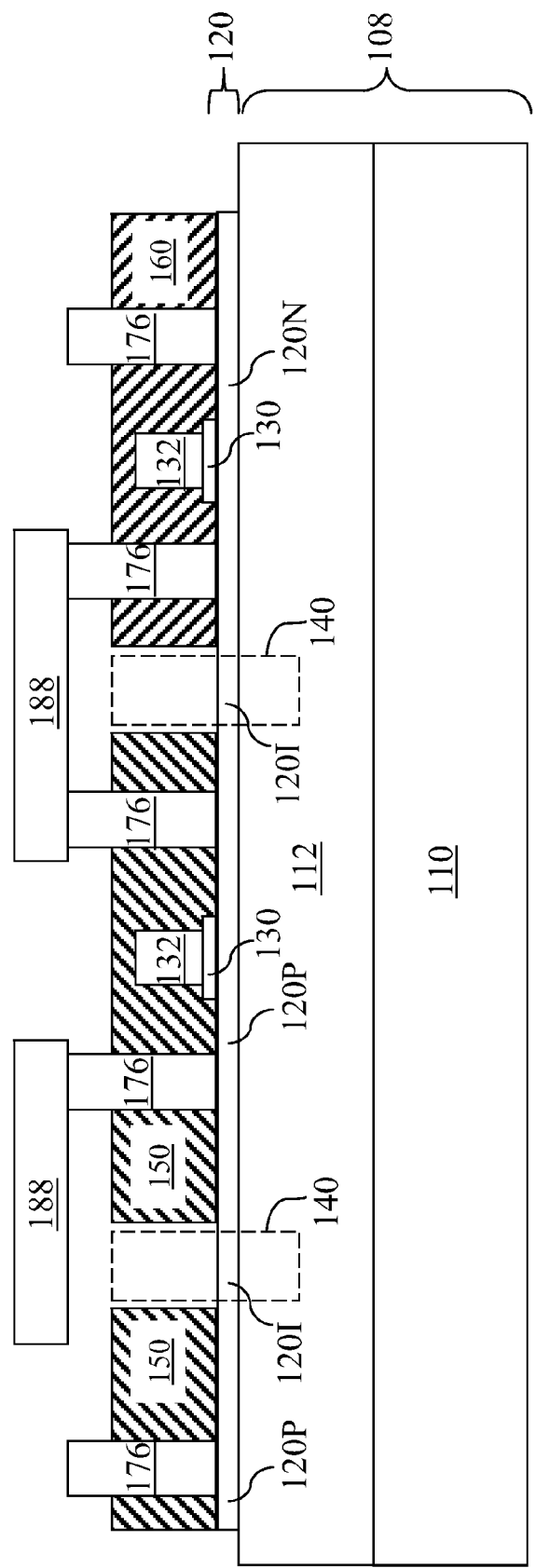
FIG. 7 is a cross-sectional view of a prototypical semiconductor structure formed on a semiconducting carbon nanotube according to the present invention.

Referring to FIG. 7, a prototypical semiconductor structure, employing a semiconducting carbon nanotube and on which four exemplary semiconductor structures to be subsequently introduced are based on, is shown. The prototypical semiconductor structure comprises a semiconducting carbon nanotube 120 formed on a substrate 108. The substrate 108 comprises a handle substrate 110 and an insulator layer 112. The handle substrate 110 may be a semiconductor substrate, a metal substrate, an insulator substrate, or a composite stack thereof such as a semiconductor-on-insulator (SOI) substrate.

The semiconducting carbon nanotube 120 is formed on the substrate 108 employing methods known in the art. For example, U.S. Pat. No. 7,183,228 to Dai et al., U.S. Pat. No. 7,229,747 to Park et al., U.S. Pat. No. 7,160,532 to Liu et al., and U.S. Pat. No. 6,833,558 to Lee et al. disclose various methods of manufacturing semiconducting carbon nanotubes, the entire contents of which are incorporated herein by reference. The diameter of the semiconducting carbon nanotube 120 is selected to provide suitable level of charge carriers, which may be estimated by the band gap $E_g$ calculated by equation (1) described above. Typical diameter of the semiconducting carbon nanotube 120 may be from about 1.7 nm to about 3 nm, although lesser and greater diameters are also explicitly contemplated herein. The length of the carbon nanotube may be from about 200 nm to about 10 microns, although lesser and greater lengths are also explicitly contemplated herein.

The prototypical semiconductor structure comprises two types of patterned charge-carrier-inducing material layers, which are a hole-inducing material layer 150 and an electron-inducing material layer 160. The hole-inducing material layer 150 induces holes in, and repels electrons from, hole-induced regions 120P located in the semiconducting carbon nanotube 120 and directly below the hole-inducing material layer 150. Likewise, electron-inducing material layer 160 induces electrons in, and repels holes from, electron-induced regions 120N located in the semiconducting carbon nanotube 120 and directly below the electron-inducing material layer 160. Materials that induce holes or electrons in the semiconducting carbon nanotube are known in the art. See J. Chen, et al., or D. Kang et al, for example. Non-limiting examples of materials that may be employed in the hole-inducing material layer 150 include triethyloxonium hexachloroantimonate in dichlorobenze. Further, exposure of a carbon nanotube to an oxygen-containing atmosphere has been shown to induce holes in a carbon nanotube by forming a surface layer containing carbon-oxygen bonds on the carbon nanotube. Non-limiting examples of materials that may be employed in the electron-inducing material layer 160 include potassium and polyethyleneimine. The thickness of the each of the hole-inducing material layer 150 and the electron-inducing material layer 160 may be from 10 nm to about 300 nm, although lesser and greater thicknesses are also explicitly contemplated herein.

Semiconductor devices such as transistors, diodes, resistors, capacitors, etc. may be formed on the semiconducting carbon nanotube 120. This is achieved by forming the components of the prototypical semiconductor structure sequentially. For example, a gate dielectric layer (not shown) may be formed and patterned to form gate dielectrics 130 on the semiconducting carbon nanotube 120 by methods well known in the art. The gate dielectrics 130 may comprise a silicon oxide formed by low temperature chemical vapor deposition (CVD) or alternately, the gate dielectrics 130 may comprise a high-k dielectric material such as $HfO_2$, $ZrO_2$, $Al_2O_3$, $TiO_2$, $La_2O_3$, $SrTiO_3$, $LaAlO_3$, $Y_2O_3$, mixtures thereof, and silicates thereof. The physical thickness of the gate dielectric 130 may be optimized for performance, and is from about 0.7 nm to about 20 nm, with a thickness from about 1 nm to about 7 nm being typical. Gate electrodes 132 are formed by deposition of a conductive layer containing a doped semiconductor alloy, an elemental metal, and/or a metallic alloy, followed by patterning of the conductive layer, for example, by lithographic methods and at least one etch. The hole-inducing material layer 150 and the electron-inducing material layer 160 are deposited and lithographically patterned at this step to form various hole-induced regions 120P and the electron-induced regions 120N in the semiconducting carbon nanotube 120. Contact vias 176 are made by forming contact holes in the hole-inducing material layer 150, the electron-inducing material layer 160, and/or any other dielectric layer that may be present over the semiconducting carbon nanotube 120 and filling the contact holes with another conductive material and planarizing the conductive material. This conductive material may comprise another doped semiconductor alloy, another elemental metal, or another metallic alloy, and may, or may not, be the same as the conductive material that the gate electrodes 132 comprise. Interconnect wiring 188, which typically has a metallic composition, provides electrical connection between the contact vias as necessary.

Electrical isolation structures 140 are formed during the formation of the semiconductor devices employing various methods to be subsequently described. In general, the electrical isolation structures 140 provide electrical isolation between two regions of the semiconducting carbon nanotube 120 that each of the electrical isolation structures 140 laterally abut. In case the semiconducting carbon nanotube 120 is still present in one of the electrical isolation structures 140, an electrical insulation region 120I is formed in the electrical isolation structure 140. The electrical isolation region contains at least one reverse biased p-n junction within the semiconducting carbon nanotube 120.

Figure 8A:
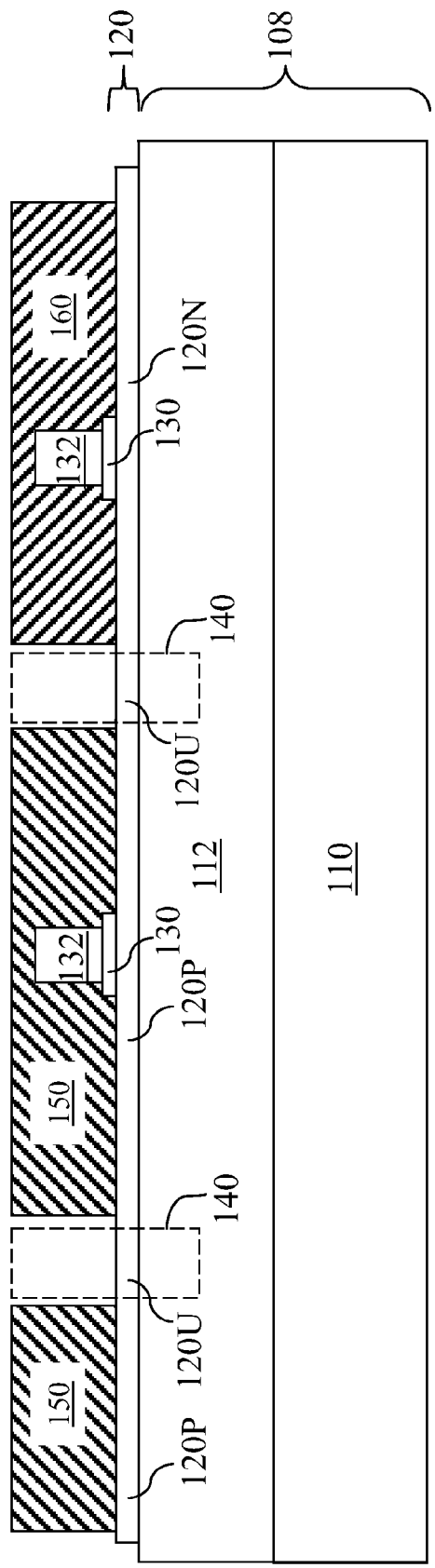
FIGS. 8A-8C are sequential vertical cross-sectional views of a first exemplary semiconductor structure according to a first embodiment of the present invention at various stages of processing steps.

Referring to FIG. 8A, a first exemplary semiconductor structure comprises a substrate 108, a carbon nanotube 120, gate dielectrics 130, gate electrodes 132, a hole-inducing material layer 150, and an electron-inducing material layer 160 as in the prototypical semiconductor structure of FIG. 7. During patterning of the hole-inducing material layer 150 and the electron-inducing material layer 160, the portions of the semiconducting carbon nanotube 120 in the electrical isolation structures 140 are exposed. Edges of the hole-inducing material region 150 and the electron-inducing material region 160 substantially coincide with the edges of the electrical isolation region 140.

Figure 8B:
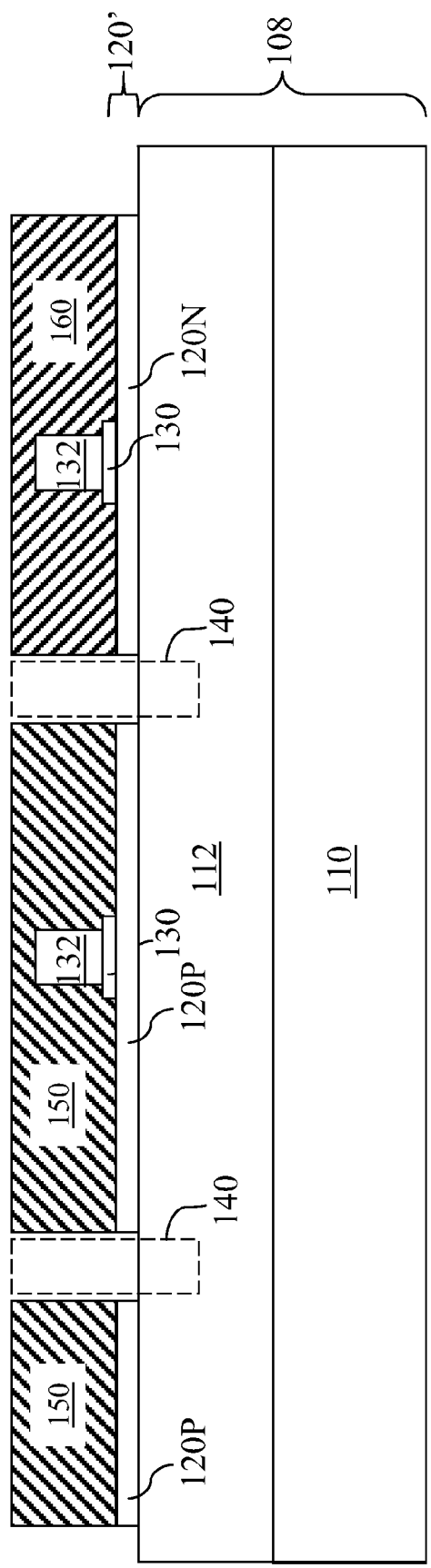

Referring to FIG. 8B, employing the hole-inducing material layer 150 and the electron-inducing material layer 160 as an etch template, exposed portions of the semiconducting carbon nanotubes are removed by an etch, which may be, for example, a reactive ion etch (RIE), chemical dry etch (CDE), or a wet etch. The semiconducting carbon nanotube 120 prior to the etch becomes a set of semiconducting carbon nanotubes 120' that are coaxially aligned to one another and having the same diameter. Each of the set of the semiconducting carbon nanotubes 120' is disjoined from one another by at least one electrical isolation 140, which is an absence of a conducting material, and specifically, an absence of a semiconducting carbon nanotube, between adjacent elements among the set of the semiconducting carbon nanotubes 120'. In other words, a discontinuity is introduced within segments of the semiconducting carbon nanotube 120 in the area of the electrical isolation structures 140 by a cut, or a removal, of the exposed portions of the semiconducting carbon nanotube 120.

Figure 8C:
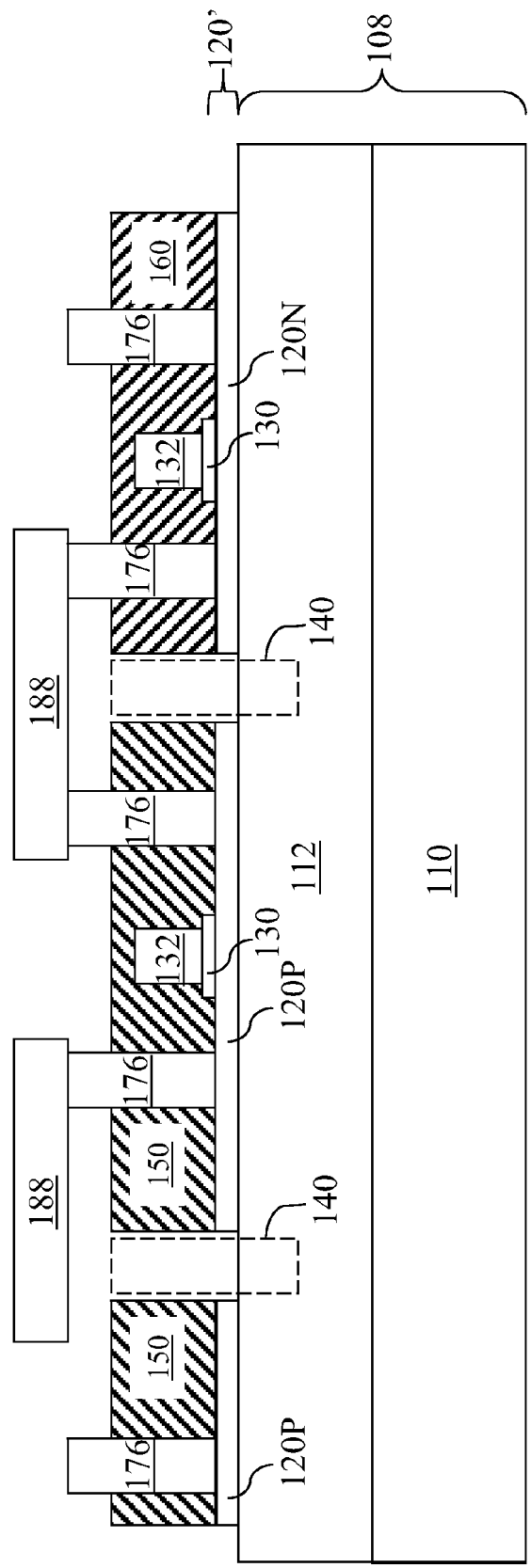

Referring to FIG. 8C, contact vias 176 and interconnect wiring 188 are formed in the first exemplary semiconductor structure as in the prototypical semiconductor structure of FIG. 7.

Figure 9A:
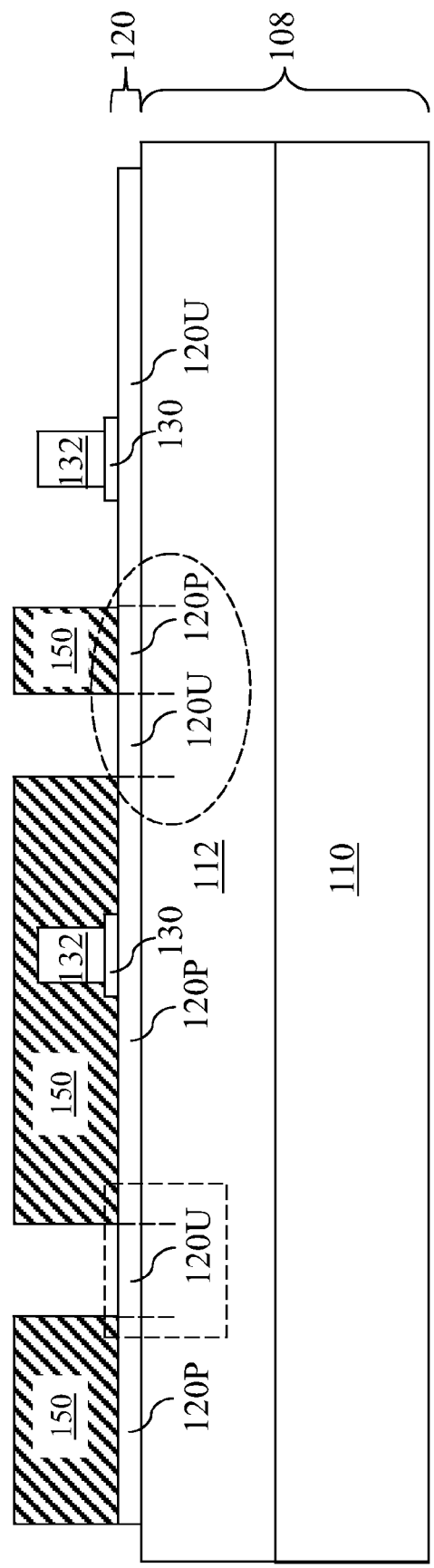
FIGS. 9A-9C are sequential vertical cross-sectional views of a second exemplary semiconductor structure according to a second embodiment of the present invention at various stages of processing steps.

Referring to FIG. 9A, a second semiconductor structure according to a second embodiment of the present invention comprises a substrate 108, a carbon nanotube 120, gate dielectrics 130, gate electrodes 132, and a hole-inducing material layer 150 as in the prototypical semiconductor structure of FIG. 7. Hole-induced regions 120P are formed in portions of the semiconducting carbon nanotube 120 directly beneath the hole-inducing material layer 150. Unperturbed regions 120U of the semiconducting carbon nanotube 120, in which carrier charges are balanced since charge carriers are not induced, are formed between each of the hole-induced regions 120P. The charge balance within the unperturbed region 120U is neutral since neither type of charge carriers is attracted to, or repelled from, the unperturbed region 120U. Only one of the two carrier-charge-inducing material layers (150, 160) of FIG. 7 is formed at this step.

In case each of an adjacent pair of a hole-induced region 120P and an unperturbed region 120U contain a semiconductor device, another pair of a hole-induced region 120P and an unperturbed region 120U that does not contain a semiconductor device is formed, as exemplified by the structure within a dashed line oval in FIG. 9A, between the pair between the adjacent pair of the hole-induced region 120P and the unperturbed region 120U. An unperturbed region 120U is formed naturally between each pair of adjacent but disjoined hole-induced regions 120P, as exemplified by the unperturbed region 120U within a dashed line rectangle in FIG. 9A. Likewise, a hole-induced region 120P is formed naturally between each pair of adjacent but disjoined unperturbed regions 120U.

Figure 9B:
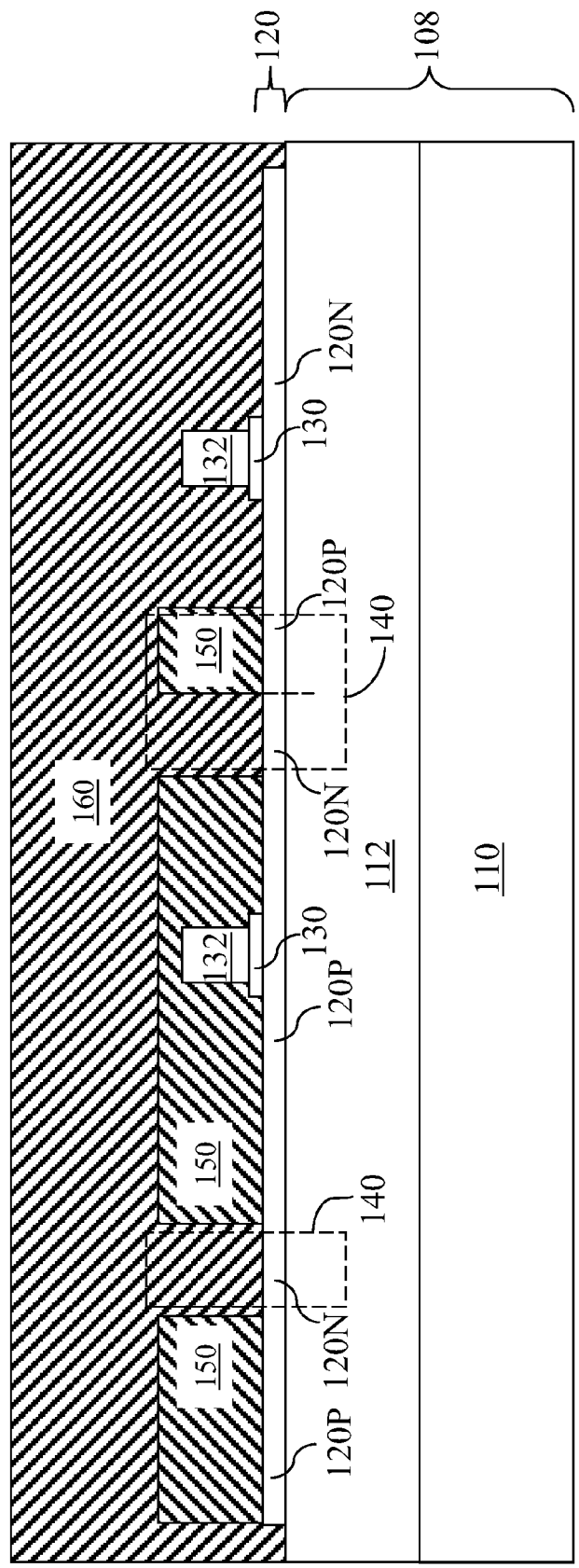

Referring to FIG. 9B, an electron-inducing material layer 160 is formed on the exposed portions of the semiconducting carbon nanotube 120, the hole-inducing material layer 150, and other exposed components located on the substrate 108. Particularly, the electron-inducing material layer 160 is formed on the unperturbed regions 120U of the semiconducting carbon nanotube, and converts the unperturbed regions 120U into electron-induced regions 120N as the electron-inducing material layer 160 attracts electrons to, and repels holes from, the unperturbed regions 120U. Thus, the unperturbed regions 120U are perturbed by an electric filed of the electron-inducing material layer 160 to become the electron-induced regions 120N.

Electrical isolation structures 140 are formed between adjacent regions of the semiconducting carbon nanotube 120 containing semiconductor devices by one of a p-n-p-n junction, p-n-p junction, or an n-p-n junction across one of the two regions of the semiconducting carbon nanotube 120, the portion of the semiconducting carbon nanotube 120 within the electrical isolation structure 140, and the other of the two regions of the semiconducting carbon nanotube 120. Specifically, an electrical isolation structure 140 between a first region, which is a hole-induced region 120P, and a second region, which is an electron-induced region 120N, may comprise a laterally abutting pair of a third region and a fourth region of the semiconducting carbon nanotube 120, wherein the laterally abutting pair is located in the semiconducting carbon nanotube 120, wherein charge carriers are predominantly electrons in the third region and predominantly holes in the fourth region, i.e., the third region is another electron induced region 120N and the fourth region is another hole-induced region 120P, and wherein the third region laterally abuts the first region and the fourth region laterally abuts the second region. In this case, the first region, the third region, the fourth region, and the second region constitute a p-n-p-n junction that provides electrical isolation between the first region and the second region.

Alternately, an electrical isolation structure 140 between a first region and a second region of the semiconducting carbon nanotube 120, in which charge carriers of the first region and the second region are of a first conductivity type, i.e., both the first region and the second region are hole-induced regions 120P or both of the first region and the second region are electron-induced regions 120N, comprises a third region of the semiconducting carbon nanotube 120, wherein charge carriers in the third region are predominantly of a second conductivity type which is the opposite of the first conductivity type, and wherein the third region laterally abuts the first region and the second region. In case the both the first region and the second region are hole-induced regions 120P, the first region, the third region, and the second region constitute a p-n-p junction that provides electrical isolation between the first region and the second region. In case both the first region and the second region constitute electron-induced regions 120N, the first region, the third region, and the second region constitute an n-p-n junction that provides electrical isolation between the first region and the second region.

Figure 9C:
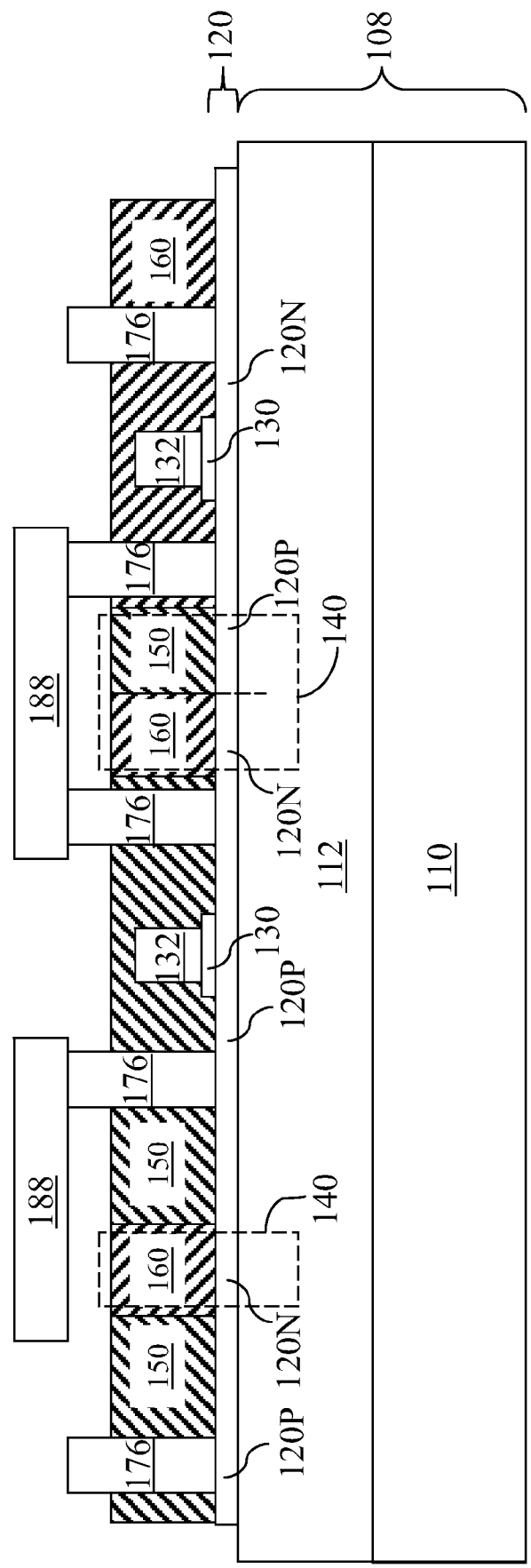

Referring to FIG. 9C, the electron-inducing material layer 160 is planarized, for example, by a reactive ion etch (RIE), a chemical dry etch (CDE), a wet etch, and/or chemical mechanical planarization (CMP). The electron-inducing material layer 160 may thereafter be patterned as needed. Contact vias 176 and interconnect wiring 188 are formed in the first exemplary semiconductor structure as in the prototypical semiconductor structure of FIG. 7.

While the second embodiment is described with a processing sequence in which the hole-inducing material layer 150 is formed first, followed by formation of the electron-inducing material layer 160, reversal of order between the formation of the two charge-carrier-inducing material layers (150, 160) is explicitly contemplated herein.

Figure 10A:
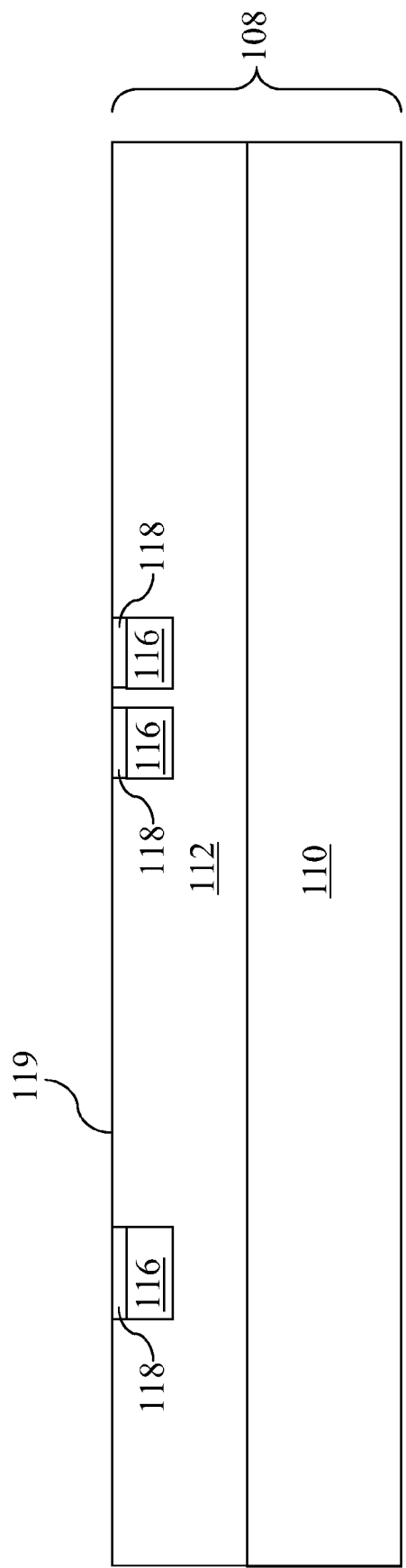
FIGS. 10A-10B are sequential vertical cross-sectional views of a third exemplary semiconductor structure according to a third embodiment of the present invention at various stages of processing steps.

Referring to FIG. 10A, a third exemplary semiconductor structure according to a third embodiment of the present invention comprises a substrate 108 containing a handle substrate 110 and an insulator layer 112. Trenches are formed in the insulator layer 112 by removing patterned portions of the insulator layer 112, for example, by a reactive ion etch employing a patterned etch mask (not shown). At least one buried electrode 116 is formed within the insulator layer 112 in areas in which electrical isolation structures are to be subsequently formed. The at least one buried electrode 116 may comprise a doped semiconductor material, an elemental metal, and/or a metallic alloy. A dielectric cap 118 is formed over each of the at least one buried electrode 116. Preferably, the dielectric cap 118 has a top surface that is flush with a top surface 119 of the substrate 108. Variations of the third embodiment in which top surface(s) of the at least one buried electrode 116 is flush with the top surface 119 of the substrate 108 and the set of dielectric caps 118 is a single contiguous dielectric layer are explicitly contemplated herein.

Figure 10B:
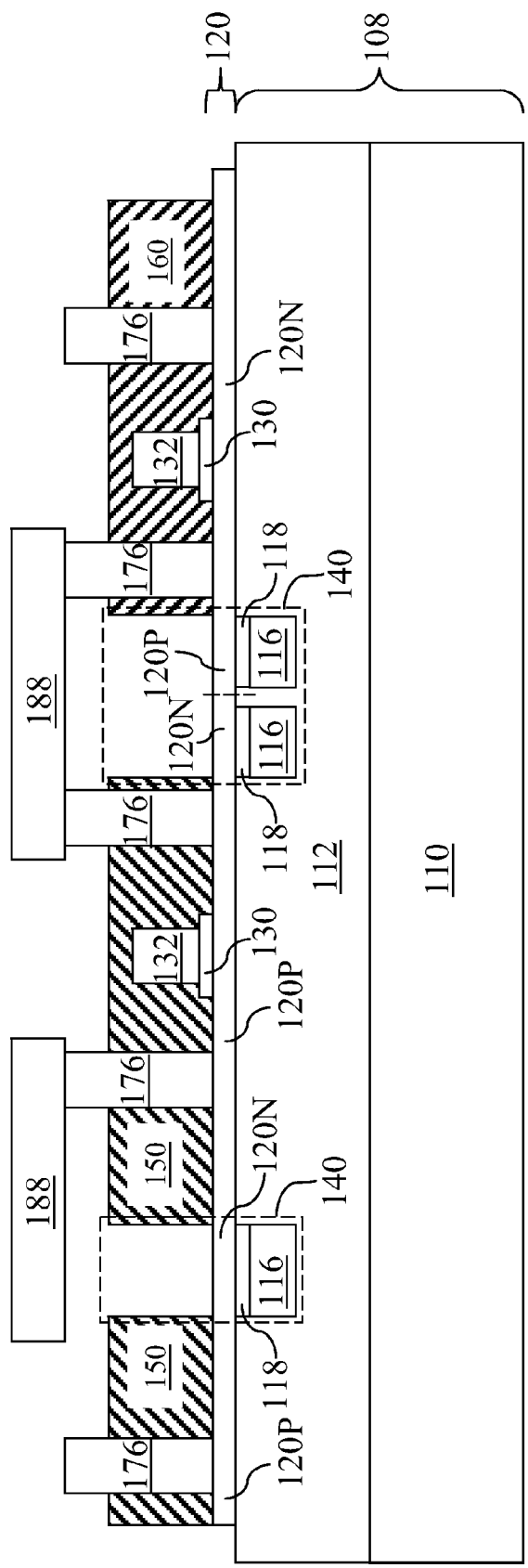

Referring to FIG. 10B, a semiconducting carbon nanotube 120 is formed on the substrate 108 in alignment to the set of the at least one buried electrode 116. Gate dielectrics 130, gate electrodes 132, a hole-inducing material layer 150, and an electron-inducing material layer 160 are formed as in the prototypical semiconductor structure of FIG. 7. The at least one buried electrode 116 is capacitively coupled to portions of the semiconducting carbon nanotube 120 that overlies the at least one buried electrode 116 through a dielectric cap 118. An electrical bias is applied to each of the at least one buried electrode 116 to attract one type of charge carriers, while repelling the opposite type of charge carriers, in the portion of the semiconducting carbon nanotube 120 located directly thereabove, which becomes either a hole-induced region 120P or an electron-induced region 120N. The polarity of the electrical bias is selected such that a p-n-p-n junction, an n-p-n junction, or a p-n-p junction is formed around the portion of the semiconducting carbon nanotube 120 that is capacitively coupled with one of the at least one buried electrode 116. At least one charge-carrier-induced region, at least one dielectric cap 118 therebelow, and at least one buried electrode 116 that underlies the at least one dielectric cap 118 collectively constitute an electrical isolation structure 140. The at least one charge-carrier-induced region may be a pair of a hole-induced region 120P and an electron-induced region 120N, a hole-induced region 120P, or an electron-induced region 120N. The at least one charge-carrier-induced region is formed by application of an electrical bias to each of the at least one buried electrode 116 within one of the electrical isolation structures 140, which may be after completion of the manufacture of the third exemplary semiconductor structure, or during operation of a device containing the third exemplary semiconductor structure.

The hole-inducing material layer 150 and the electron-inducing material layer 160 may, or may not, be formed over the portions of the semiconducting carbon nanotube 120 overlying each of the at least one buried electrode 116. In one case, the hole-inducing material layer 150 and the electron-inducing material layer 160 are not formed over the portions of the semiconducting carbon nanotube 120 overlying each of the at least one buried electrode 116. In another case, the hole-inducing material layer 150 may be formed over a hole-induced region 120P overlying a buried electrode 116, or the electron-inducing material layer 160 may be formed over an electron-induced region 120N overlying another buried electrode 116. Contact vias 176 and interconnect wiring 188 are subsequently formed as in the prototype semiconductor structure in FIG. 7.

Figure 11:
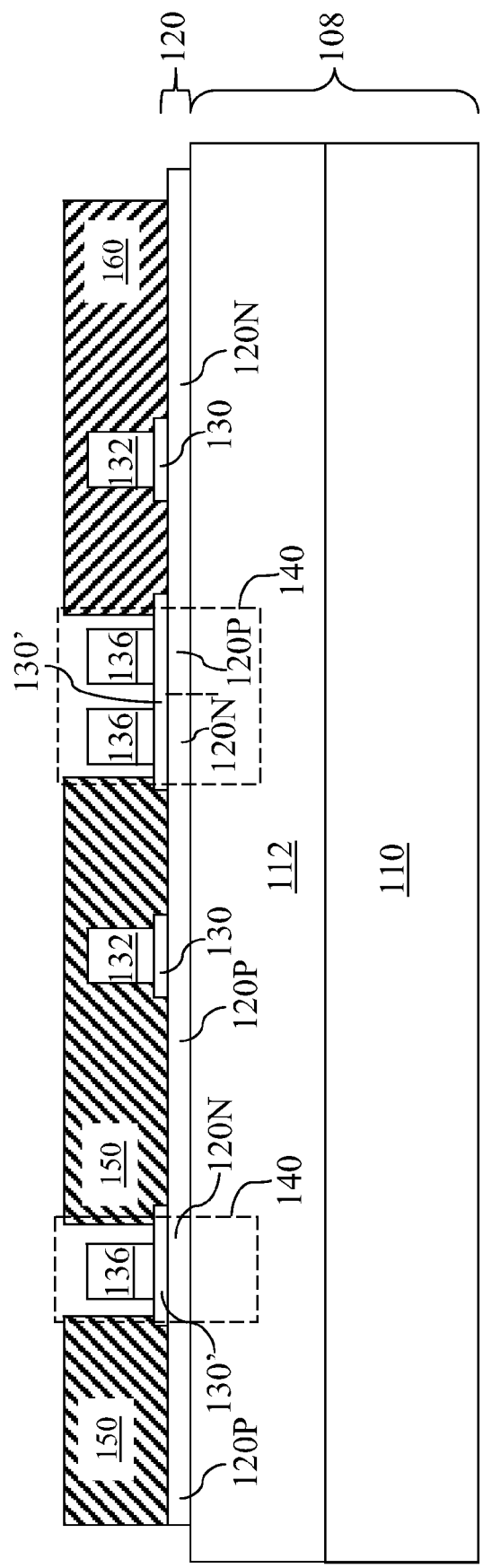
FIG. 11 is a vertical cross-sectional view of a fourth exemplary semiconductor structure according to a fourth embodiment of the present invention.

Referring to FIG. 11, a fourth exemplary semiconductor structure according to a fourth embodiment of the present invention comprises a substrate 108 and a semiconducting carbon nanotube 120 formed as in the prototype semiconductor structure of FIG. 7. At least one dielectric material portion 130' is formed over the semiconducting carbon nanotube 120 at the same processing step at which the gate dielectrics 130 are formed. Specifically, the same dielectric material layer (not shown) is formed on the semiconducting carbon nanotube 120 and patterned so that some portions constitute the gate dielectric 130 and some other portions constitute the at least one dielectric material portion 130'. Consequently, the gate dielectrics 130 and the at least one dielectric material portion 130' comprise the same material and have the same thickness. Further, at least one electrode 136 is formed on each of the at least one dielectric material portion 130' at the same processing step as formation of gate electrodes 132.

An electrical bias is applied to each of the at least one electrode 136 to attract one type of charge carriers, while repelling the opposite type of charge carriers, in the portion of the semiconducting carbon nanotube 120 located directly therebelow, which becomes either a hole-induced region 120P or an electron-induced region 120N. The polarity of the electrical bias is selected such that a p-n-p-n junction, an n-p-n junction, or a p-n-p junction is formed around the portion of the semiconducting carbon nanotube 120 that is capacitively coupled with one of the at least one electrode 136. At least one charge-carrier-induced region, at least one dielectric material portion 130' thereabove, and at least one electrode 136 that overlies the at least one dielectric material portion 130' collectively constitute an electrical isolation structure 140. The at least one charge-carrier-induced region may be a pair of a hole-induced region 120P and an electron-induced region 120N, a hole-induced region 120P, or an electron-induced region 120N. The at least one charge-carrier-induced region is formed by application of an electrical bias to each of the at least one electrode 136 within one of the electrical isolation structures 140, which may be after completion of the manufacture of the fourth exemplary semiconductor structure, or during operation of a device containing the fourth exemplary semiconductor structure.

The hole-inducing material layer 150 and the electron-inducing material layer 160 may, or may not, be formed over the at least one electrode 136. In one case, the hole-inducing material layer 150 and the electron-inducing material layer 160 are not formed over the at least one electrode 136. In another case, the hole-inducing material layer 150 may be formed over one of the at least one electrode 136, or the electron-inducing material layer 160 may be formed over the at least one electrode 136. Contact vias 176 and interconnect wiring 188 are subsequently formed as in the prototype semiconductor structure in FIG. 7.

Figure 12:
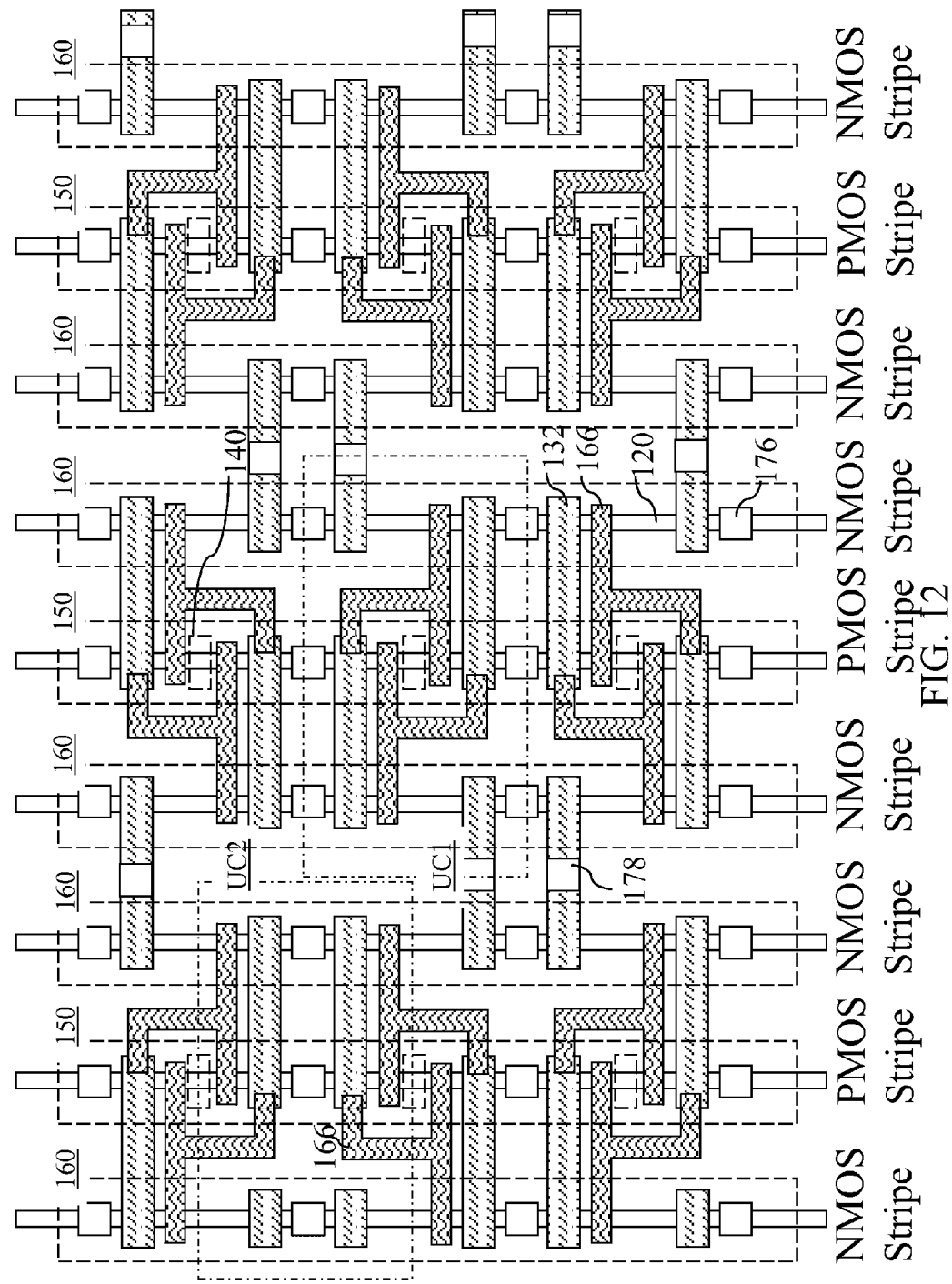
FIG. 12 is a top-down view of an exemplary static random access memory (SRAM) array according to a fifth embodiment of the present invention.

Referring to FIG. 12, a fifth exemplary semiconductor structure according to a fifth embodiment of the present invention comprises a static random access memory (SRAM) array containing devices formed on a plurality of semiconducting carbon nanotubes 120 arranged parallel to one another on a substrate (not shown). A hole-inducing material layer 150 of which the boundary is represented by a dashed rectangle is formed on each of the semiconducting carbon nanotubes 120 that are labeled "PMOS Stripe." An electron-inducing material layer 160 of which the boundary is represented by another dashed rectangle is formed on each of the semiconducting carbon nanotubes 120 that are labeled "NMOS Stripe." The hole-inducing material layer 150 and the electron-inducing material layer 160 are charge-carrier-inducing material layers having the same properties as in the prototypical semiconductor structure of FIG. 7.

A predominant portion of each of the semiconducting carbon nanotubes 120 that are labeled "PMOS Stripe" is of p-type, i.e., contains holes as majority of charge carriers Likewise, a predominant portion of each of the semiconducting carbon nanotubes 120 that are labeled "NMOS Stripe" is of n-type, i.e., contains electrons as majority of charge carriers. In the inventive SRAM array containing the plurality of semiconducting carbon nanotubes 120, a pattern of the hole-inducing material layer 150 and the electron-inducing material layer 160 is substantially one dimensional and changes substantially row by row. Electrons within each of the semiconducting carbon nanotubes 120 that are labeled "PMOS Stripe" may be clustered in regions outside the area of the hole-inducing material layer 150, or in case electrical isolation regions 140 contain at least one electron-induced region 120N (See FIGS. 9C, 10B, or 11) as in the second through fourth embodiment of the present invention, may be clustered in the at least one electron-induced region 120N. In the same manner, holes within each of the semiconducting carbon nanotubes 120 that are labeled "NMOS Stripe" may be clustered in regions outside the area of the electron-inducing material layer 160, or in case electrical isolation regions 140 contain at least one hole-induced region 120P (See FIGS. 9C, 10B, or 11) as in the second through fourth embodiment of the present invention, may be clustered in the at least one hole-induced region 120P.

It is noted that the term "predominant portion" refers to the volume of a semiconducting carbon nanotube 120 containing one type of charge-carrier-inducing region relative to the total volume of the semiconducting carbon nanotube 120 containing semiconductor devices. In other words, only the volume of the semiconducting carbon nanotube 120 containing semiconductor devices is used in calculating whether a portion of the semiconducting carbon nanotube 120 is a predominant portion since it is possible to build semiconductor devices only on a small faction of a semiconducting carbon nanotube 120, while not building any semiconductor devices on the rest of the semiconducting carbon nanotube 120. A predominant portion may occupy more than 50% of a semiconducting carbon nanotube 120, and preferably occupies more than 80% of the semiconducting carbon nanotube 120, and most preferably occupies more than 90% of the semiconducting carbon nanotube 120.

Gate electrodes 132, electrical isolation structures 140, and the contact vias 176 have the same structural and compositional properties and may be formed by the same methods as in the first through fourth embodiments. Local interconnects 166 provide electrical contact between adjacent semiconducting carbon nanotubes 120 and gate electrodes 132. Gate electrodes 132 are adjoined to another gate electrode 132 in a neighboring semiconducting carbon nanotube 120 such that the two adjoined gate electrodes 132 are of integral and unitary construction, i.e., are physically one piece.

A first unit cell UC1 and a second unit cell UC2 of the inventive SRAM array are marked with dashed rectangles.

The first unit cell UC1 and the second unit cell UC2 are two different unit cells of the inventive SRAM array that contain the same components in different arrangements. The first unit cell UC1 comprises a functional SRAM unit cell, i.e., a unit cell that provides the full functionality of an SRAM unit cell, while the second unit cell UC2 comprises half of a first functional unit cell and half of a second functional SRAM unit cell that is adjoined to the first functional SRAM unit cell.

Figure 13:
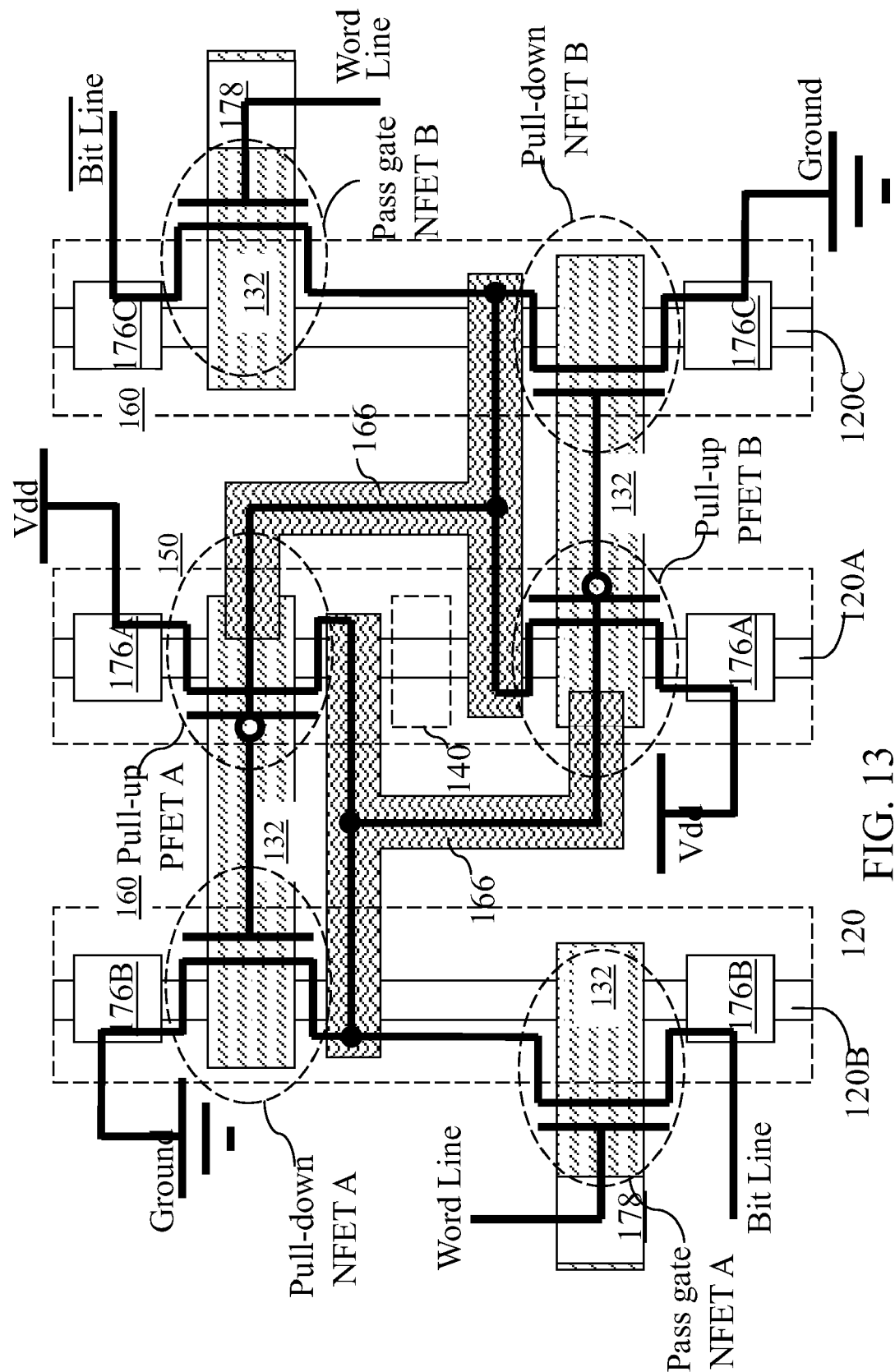
FIG. 13 is a superposition of a top-down view of a first unit cell UC1 of the exemplary static random access memory (SRAM) array of FIG. 12 according to the fifth embodiment of the present invention and a circuit schematic corresponding to the components of the first unit cell UC1 of the exemplary SRAM array.

Referring to FIG. 13, a magnified view of the first unit cell UC 1 and a circuit schematic for the first unit cell UC1 superposed such that each circuit symbol is located on a corresponding physical structure. The semiconducting carbon nanotubes 120 in FIG. 13 are classified into first semiconducting carbon nanotubes 120A on which pull-up p-type field effect transistors (PFETs) are formed, second semiconducting carbon nanotubes 120B located immediately to the left of each of the first semiconducting carbon nanotubes 120A, and third semiconducting carbon nanotubes 120C located immediately to the right of each of the first semiconducting carbon nanotubes 120A. Features of the inventive SRAM array may be readily identified. Among the features of the inventive SRAM array as shown are:

a first semiconducting carbon nanotube 120A, wherein a predominant portion of the first semiconducting carbon nanotube 120A is of p-type;

a second semiconducting carbon nanotube 120B located next to and on one side of the first semiconducting carbon nanotube 120A, wherein a predominant portion of the second semiconducting carbon nanotube 120B is of n-type; and a third semiconducting carbon nanotube 120C located next to and on an opposite side of the first semiconducting carbon nanotube 120A, wherein a predominant portion of the third semiconducting carbon nanotube 120C is of n-type.

The first unit cell UC1 comprises six transistors which are two pull-up PFETs, two pull-down n-type field effect transistors (NFETs), and two pass gate NFETs. The two pull-up PFETs are labeled "Pull-up PFET A" and "Pull-up PFET B." The two pull-down NFETs are labeled "Pull-down NFET A" and "Pull-down NFET B." The two pass gate NFETs are labeled "Pass gate NFET A" and "Pass gate NFET B."

Figure 14:
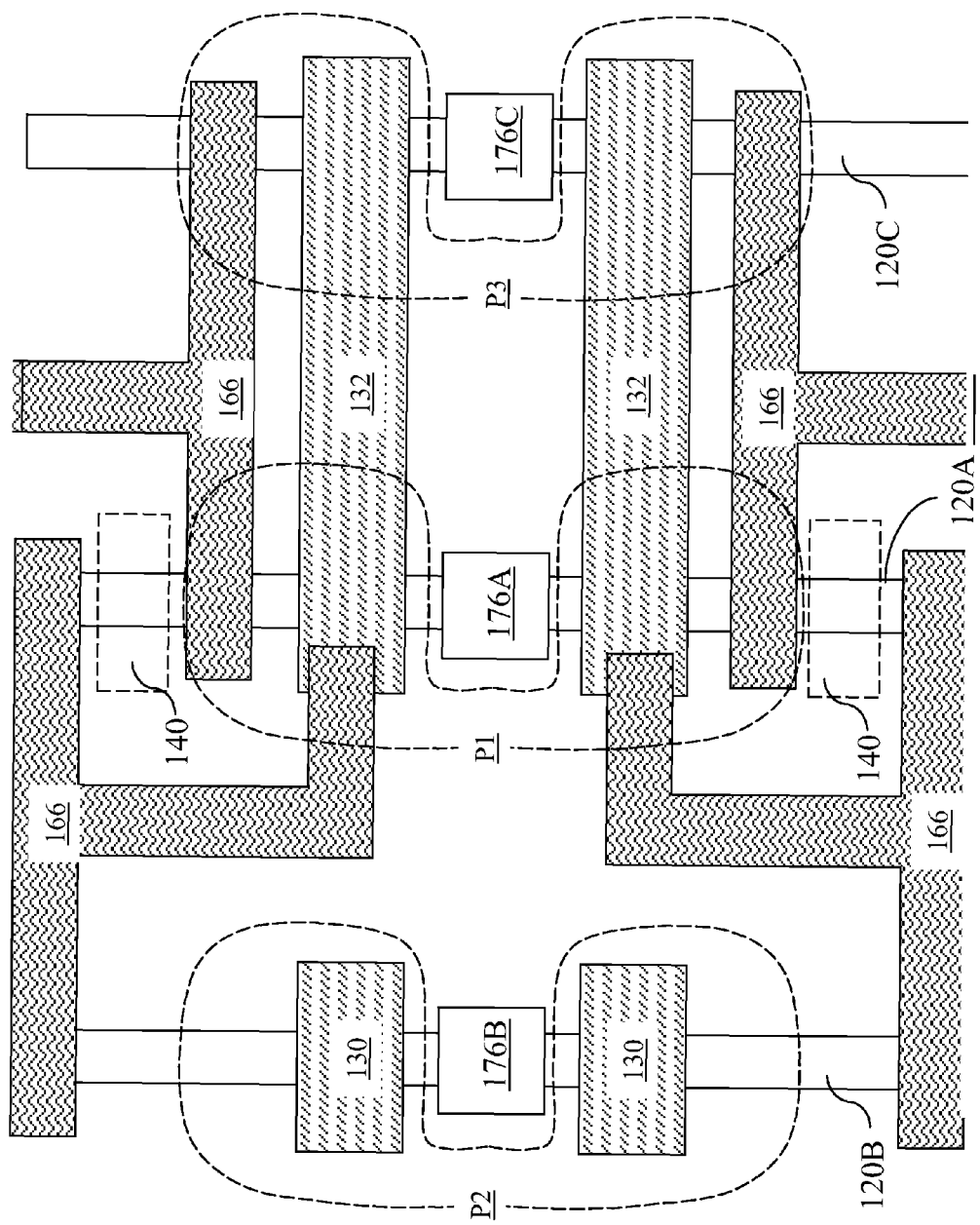
FIG. 14 is a top-down view of a second unit cell UC2 of the exemplary SRAM array of FIG. 12 according to the fifth embodiment of the present invention.

Referring to FIG. 14, a magnified view of the second unit cell UC2 in FIG. 12 shows another feature of the inventive SRAM array which includes:

a pair of p-type carbon nanotube transistors P1 located on the first semiconducting carbon nanotube 120A; and a first contact via 176A located on the first semiconducting carbon nanotube 120A and between the pair of p-type carbon nanotube transistors P1 and electrically connected to a power supply source (not shown).

The second unit cell UC2 further includes:

a pair of n-type carbon nanotube transistors P2 located on the second semiconducting carbon nanotube 120B, wherein a source or drain of each of the pair of n-type carbon nanotube transistors is electrically connected to one of gate electrodes 130 of the pair of p-type carbon nanotube transistors P1 via a pair of local interconnects 166; and a second contact via 176B located on the second semiconducting carbon nanotube 120B and between the pair of n-type carbon nanotube transistors P2 and electrically connected to a bit line (not shown).

The second unit cell UC2 further includes:

another pair of n-type carbon nanotube transistors P3 located on the third semiconducting carbon nanotube 120C, wherein a gate electrode 132 of each of the another pair of n-type carbon nanotube transistor 120C is electrically connected to one of the gate electrodes 132 of the pair of p-type carbon nanotube transistors P1; and a third contact via 176C located on the third semiconducting carbon nanotube 120C and between the pair of n-type carbon nanotube transistors P3 and electrically connected to electrical ground.

Further, the second unit cell UC2 further comprises electrical isolation structures 140 located on the first semiconducting carbon nanotube 120A and adjacent to each of the pair of p-type carbon nanotube transistors P1 on an opposite side of the first contact via 176A.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising;
    a first semiconductor device located on a first semiconducting carbon nanotube located on a substrate; and
    a second semiconductor device located on a second semiconducting carbon nanotube, wherein said second semiconducting carbon nanotube is located on said substrate, has a same diameter as said first semiconducting carbon nanotube, is coaxially aligned to said first semiconducting carbon nanotube, and does not physically contact said first semiconducting carbon nanotube, wherein a portion of a wall of each of said first and second semiconducting carbon nanotubes contacts a top surface of an insulator layer, said wall surrounding an axis of a corresponding semiconductor carbon nanotube.

2. The semiconductor structure of claim 1, wherein at least one of said first semiconductor device and said second semiconductor device is a field effect transistor.

3. The semiconductor structure of claim 1, further comprising:
    a portion of a hole-inducing material layer located directly on a first region of said first semiconducting carbon nanotube, wherein said portion of said hole-inducing material layer induces holes in, and repels electrons from, said first region;
    a portion of an electron-inducing material layer located directly on a second region of said first semiconducting carbon nanotube, wherein said portion of said electron-inducing material layer induces electrons in, and repels holes from, said second region;
    another portion of said hole-inducing material layer located directly on a third region of said second semiconducting carbon nanotube, wherein said another portion of said hole-inducing material layer induces holes in, and repels electrons from, said third region; and
    another portion of said electron-inducing material layer located directly on a fourth region of said second semiconducting carbon nanotube, wherein said another portion of said electron-inducing material layer induces electrons in, and repels holes from, said fourth region.

4. A semiconductor structure comprising a plurality of semiconducting carbon nanotubes arranged parallel to one another on a substrate, wherein a predominant portion of at least one semiconducting carbon nanotube is of a first conductivity type and a predominant portion of at least another semiconducting carbon nanotube is of a second conductivity type, wherein said second conductivity type is the opposite of said first conductivity type, and wherein a portion of a wall of each of said plurality of semiconducting carbon nanotubes contacts a top surface of an insulator layer, said wall surrounding an axis of a corresponding semiconductor carbon nanotube.

5. The semiconductor structure of claim 4, wherein said plurality of semiconducting carbon nanotubes comprise:
- a first semiconducting carbon nanotube, wherein a predominant portion of said first semiconducting carbon nanotube is of p-type;
- a second semiconducting carbon nanotube located next to and on one side of said first semiconducting carbon nanotube, wherein a predominant portion of said second semiconducting carbon nanotube is of n-type; and
- a third semiconducting carbon nanotube located next to and on an opposite side of said first semiconducting carbon nanotube, wherein a predominant portion of said third semiconducting carbon nanotube is of n-type.

6. A semiconductor structure comprising:
- a plurality of semiconducting carbon nanotubes arranged parallel to one another on a substrate, wherein a predominant portion of at least one semiconducting carbon nanotube is of a first conductivity type and a predominant portion of at least another semiconducting carbon nanotube is of a second conductivity type, wherein said second conductivity type is the opposite of said first conductivity type;
- a pair of p-type carbon nanotube transistors located on said first semiconducting carbon nanotube; and
- a first contact via located on said first semiconducting carbon nanotube and between said pair of p-type carbon nanotube transistors and electrically connected to a power supply source, wherein said plurality of semiconducting carbon nanotubes comprise:
- a first semiconducting carbon nanotube, wherein a predominant portion of said first semiconducting carbon nanotube is of p-type;
- a second semiconducting carbon nanotube located next to and on one side of said first semiconducting carbon nanotube, wherein a predominant portion of said second semiconducting carbon nanotube is of n-type; and
- a third semiconducting carbon nanotube located next to and on an opposite side of said first semiconducting carbon nanotube, wherein a predominant portion of said third semiconducting carbon nanotube is of n-type.

7. The semiconductor structure of claim 1, further comprising at least one of an electron-inducing material layer and a hole inducing material layer located directly on at least one of said first and second semiconducting carbon nanotubes.

8. The semiconductor structure of claim 7, wherein a portion of an electron-inducing material layer is located directly on said first semiconducting carbon nanotube and a portion of a hole inducing material layer is located directly on said second semiconducting carbon nanotube.

9. The semiconductor structure of claim 8, wherein said electron-inducing material layer comprises a material selected from potassium and polyethyleneimine, and said hole-inducing material layer comprises triethyloxonium hexachloroantimonate in dichlorobenze.

10. The semiconductor structure of claim 7, further comprising a stack of a gate dielectric and a gate electrode contacting one of said first and second semiconducting carbon nanotubes and embedded in one of an electron-inducing material layer and a hole inducing material layer located directly on at least one of said first and second semiconducting carbon nanotubes.

11. The semiconductor structure of claim 1, further comprising at least one carbon nanotube transistor located on at least one of said first and second semiconducting carbon nanotubes.

12. A semiconductor structure comprising;
- a first semiconductor device located on a first semiconducting carbon nanotube located on a substrate;
- a second semiconductor device located on a second semiconducting carbon nanotube, wherein said second semiconducting carbon nanotube is located on said substrate, has a same diameter as said first semiconducting carbon nanotube, is coaxially aligned to said first semiconducting carbon nanotube, and does not physically contact said first semiconducting carbon nanotube;
- a p-type carbon nanotube transistor located on said first semiconducting carbon nanotube; and
- an n-type carbon nanotube transistor located on said first semiconducting carbon nanotube.

13. The semiconductor structure of claim 4, further comprising at least one of an electron-inducing material layer and a hole inducing material layer located directly on said plurality of said semiconducting carbon nanotubes.

14. The semiconductor structure of claim 13, wherein said at least one of an electron-inducing material layer and a hole inducing material layer contacts said top surface of said insulator layer.

15. The semiconductor structure of claim 4, wherein at least one portion of an electron-inducing material layer and at least one portion of a hole inducing material layer are located directly on said plurality of semiconducting carbon nanotubes.

16. The semiconductor structure of claim 15, wherein each of said at least one portion of an electron-inducing material layer and said at least one portion of a hole inducing material layer contacts said top surface of said insulator layer.

17. The semiconductor structure of claim 15, wherein said electron-inducing material layer comprises a material selected from potassium and polyethyleneimine, and said hole-inducing material layer comprises triethyloxonium hexachloroantimonate in dichlorobenze.

18. The semiconductor structure of claim 4, further comprising at least one carbon nanotube transistor located on said plurality of said semiconducting carbon nanotubes.

19. The semiconductor structure of claim 4, further comprising a pair of p-type carbon nanotube transistors located on said first semiconducting carbon nanotube; and
- a first contact via located on said first semiconducting carbon nanotube and between said pair of p-type carbon nanotube transistors and electrically connected to a power supply source.

* * * * *